(12) United States Patent
Borremans et al.

(10) Patent No.: US 12,140,416 B2
(45) Date of Patent: Nov. 12, 2024

(54) COLLIMATING ARRAY FOR AN OPTICAL SENSING DEVICE

(71) Applicant: Spectricity, Mechelen (BE)

(72) Inventors: Jonathan Borremans, Lier (BE); Maarten De Bock, Ghent (BE); Ruben Lieten, Heverlee (BE)

(73) Assignee: Spectricity, Mechelen (BE)

( * ) Notice: Subject to any disclaimer, the term of this patent is extended or adjusted under 35 U.S.C. 154(b) by 355 days.

(21) Appl. No.: 17/007,254

(22) Filed: Aug. 31, 2020

(65) Prior Publication Data

US 2021/0140764 A1 May 13, 2021

Related U.S. Application Data

(60) Provisional application No. 62/932,304, filed on Nov. 7, 2019.

(51) Int. Cl.
| | |
|---|---|
| *G02B 5/20* | (2006.01) |
| *G01B 11/25* | (2006.01) |
| *G02B 27/30* | (2006.01) |
| *H04N 25/13* | (2023.01) |

(52) U.S. Cl.
CPC ............ *G01B 11/2531* (2013.01); *G02B 5/20* (2013.01); *G02B 27/30* (2013.01); *H04N 25/134* (2023.01)

(58) Field of Classification Search
CPC ... G02B 27/30; G02B 5/201; H01L 27/14627; H04N 9/04557
See application file for complete search history.

(56) References Cited

U.S. PATENT DOCUMENTS

| | | | | |
|---|---|---|---|---|
| 10,170,516 B2* | 1/2019 | Wu | ............... | H01L 27/14685 |
| 2005/0061950 A1* | 3/2005 | Jiang | ............... | H01L 27/14627 |
| | | | | 250/214.1 |
| 2008/0036759 A1* | 2/2008 | Koike | ............... | G02F 1/133526 |
| | | | | 345/419 |

(Continued)

FOREIGN PATENT DOCUMENTS

| | | |
|---|---|---|
| CN | 105321965 A | 2/2016 |
| CN | 105552092 A | 5/2016 |

(Continued)

OTHER PUBLICATIONS

China National Intellectual Property Administration; First Office Action; Application No. 202011191482.5; Nov. 15, 2023; 10 pgs.

*Primary Examiner* — Maurice C Smith
(74) *Attorney, Agent, or Firm* — Garlick & Markison; Kelly H. Hale

(57) ABSTRACT

An optical sensor system comprises an array of optical sensors arranged on an integrated circuit and a plurality of filters with the bottom surface of the plurality of filters located above the top surface of the array of optical sensors. The optical sensor system further comprises an angle-of-incidence layer that includes a top surface, a bottom surface, and a thickness Y, where the bottom surface of the angle-of-incidence layer is located a predetermined distance X from the top surface of the plurality of filters and the angle-of-incidence layer includes a plurality of collimating elements, with each collimating element of the angle-of-incidence layer having an aperture width Z.

20 Claims, 21 Drawing Sheets

(56) References Cited

U.S. PATENT DOCUMENTS

| | | | |
|---|---|---|---|
| 2012/0086093 A1* | 4/2012 | Otsuka | H01L 27/14627 257/E31.127 |
| 2015/0288935 A1* | 10/2015 | Shinozaki | H04N 5/345 348/322 |
| 2016/0118431 A1* | 4/2016 | Dutartre | H01L 27/1462 438/70 |
| 2017/0110501 A1* | 4/2017 | Hsu | H01L 27/14645 |
| 2017/0124370 A1* | 5/2017 | He | G06V 40/40 |
| 2017/0230551 A1* | 8/2017 | Akkaya | G02F 1/19 |
| 2017/0286743 A1* | 10/2017 | Lee | G06V 40/1318 |
| 2018/0288298 A1 | 10/2018 | Lim | |
| 2018/0329065 A1* | 11/2018 | Pacala | H04B 10/503 |
| 2019/0157337 A1* | 5/2019 | Lin | G06V 40/1318 |

FOREIGN PATENT DOCUMENTS

| | | | | |
|---|---|---|---|---|
| CN | 105593651 A | 5/2016 | | |
| CN | 106876420 A | 6/2017 | | |
| CN | 108885693 A | 11/2018 | | |
| WO | 2018139254 A1 | 8/2018 | | |
| WO | WO-2020068242 A1 * | 4/2020 | | G06F 3/0421 |

\* cited by examiner

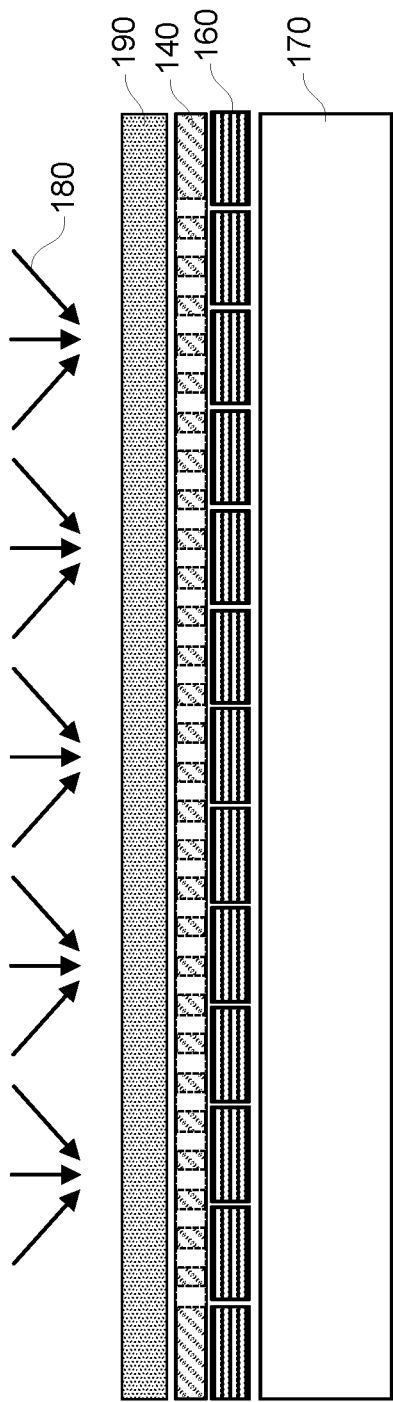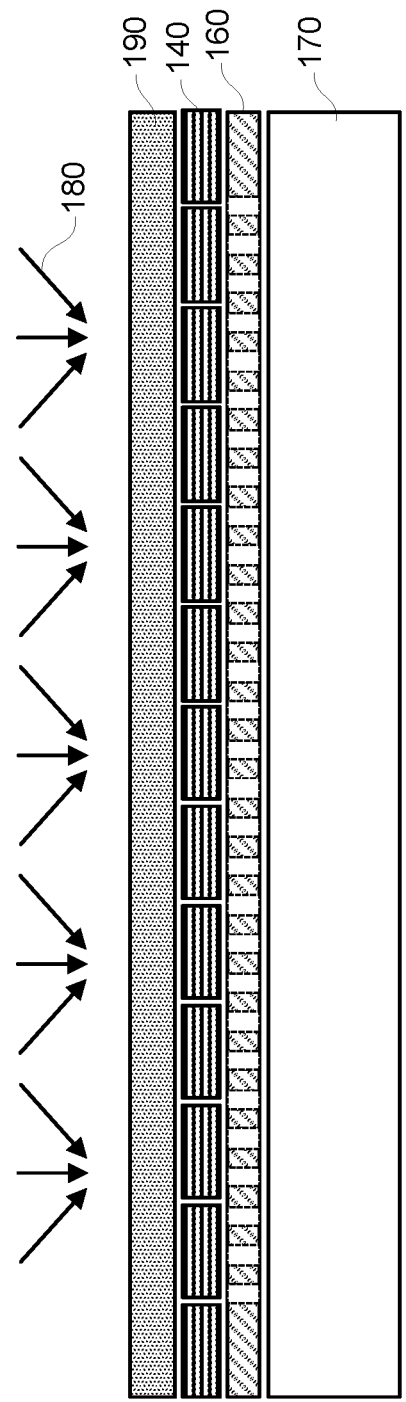

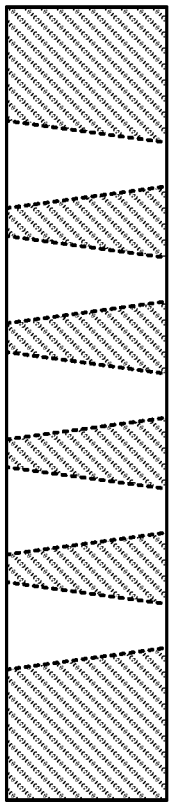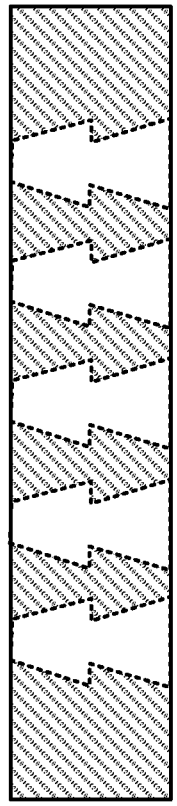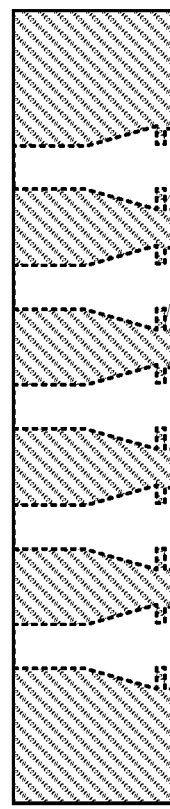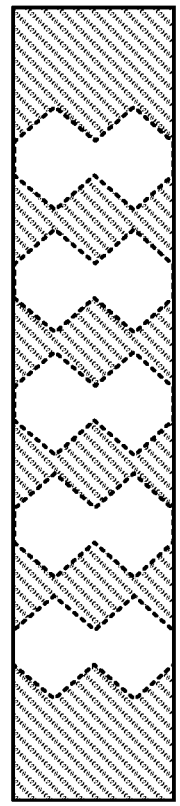
FIG. 12A  FIG. 12B  FIG. 12C  FIG. 12D  FIG. 12E  FIG. 12F

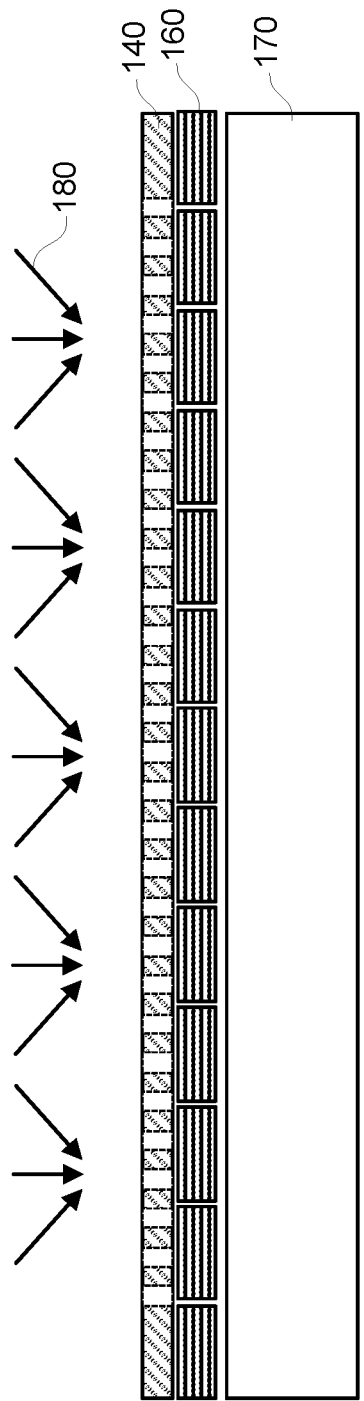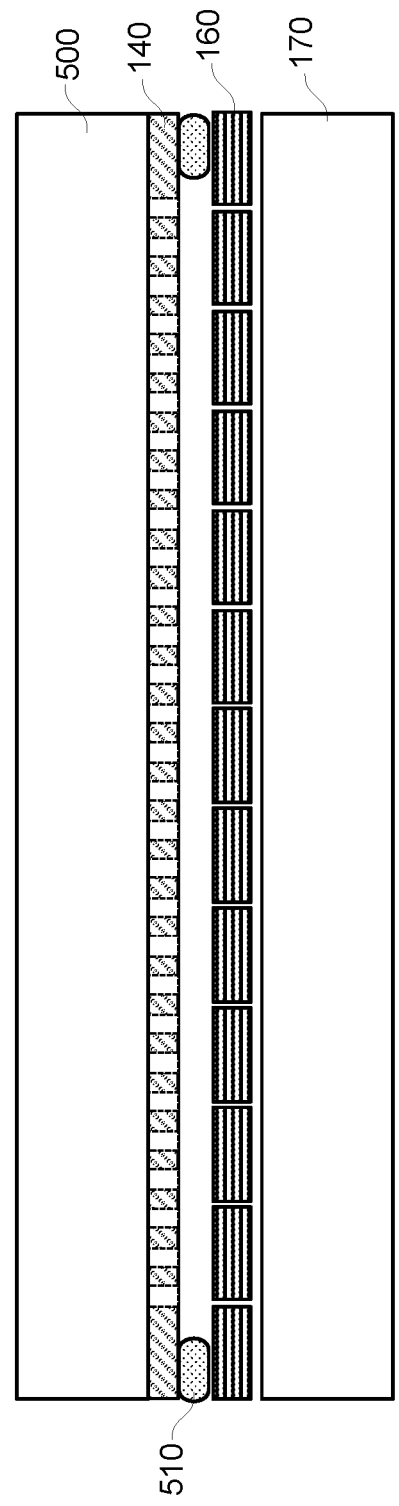

COLLIMATING ARRAY FOR AN OPTICAL SENSING DEVICE

CROSS REFERENCE TO RELATED PATENTS

The present U.S. Utility Patent Application also claims priority pursuant to 35 U.S.C. § 119(e) to U.S. Provisional Application No. 62/932,304, entitled "COLLIMATING ARRAY FOR AN OPTICAL SENSING DEVICE," filed Nov. 7, 2019, which is hereby incorporated herein by reference in their entirety and made part of the present U.S. Utility Patent Application for any and all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to spectroscopy and more particularly to spectral sensors using interference-based filters.

Spectroscopy devices have proven to be useful for applications in various industries including, for example, health, biometrics, agriculture, chemistry and fitness. Interference-based filters, such as Fabry-Pérot filters, when used in conjunction with spectroscopy, have been shown to be capable of providing useful spectral information. Light traveling through interference-based filters at an angle incident to a sensor surface of more than a relatively small amount can negatively impact a sensors performance. Many methods have been proposed to manage the angle-of-incidence through an interference-based filter, including the addition of objective lenses, slits and collimators, either alone or in combination.

DESCRIPTION OF RELATED ART

BRIEF DESCRIPTION OF THE SEVERAL VIEWS OF THE DRAWING(S)

Figure 3:
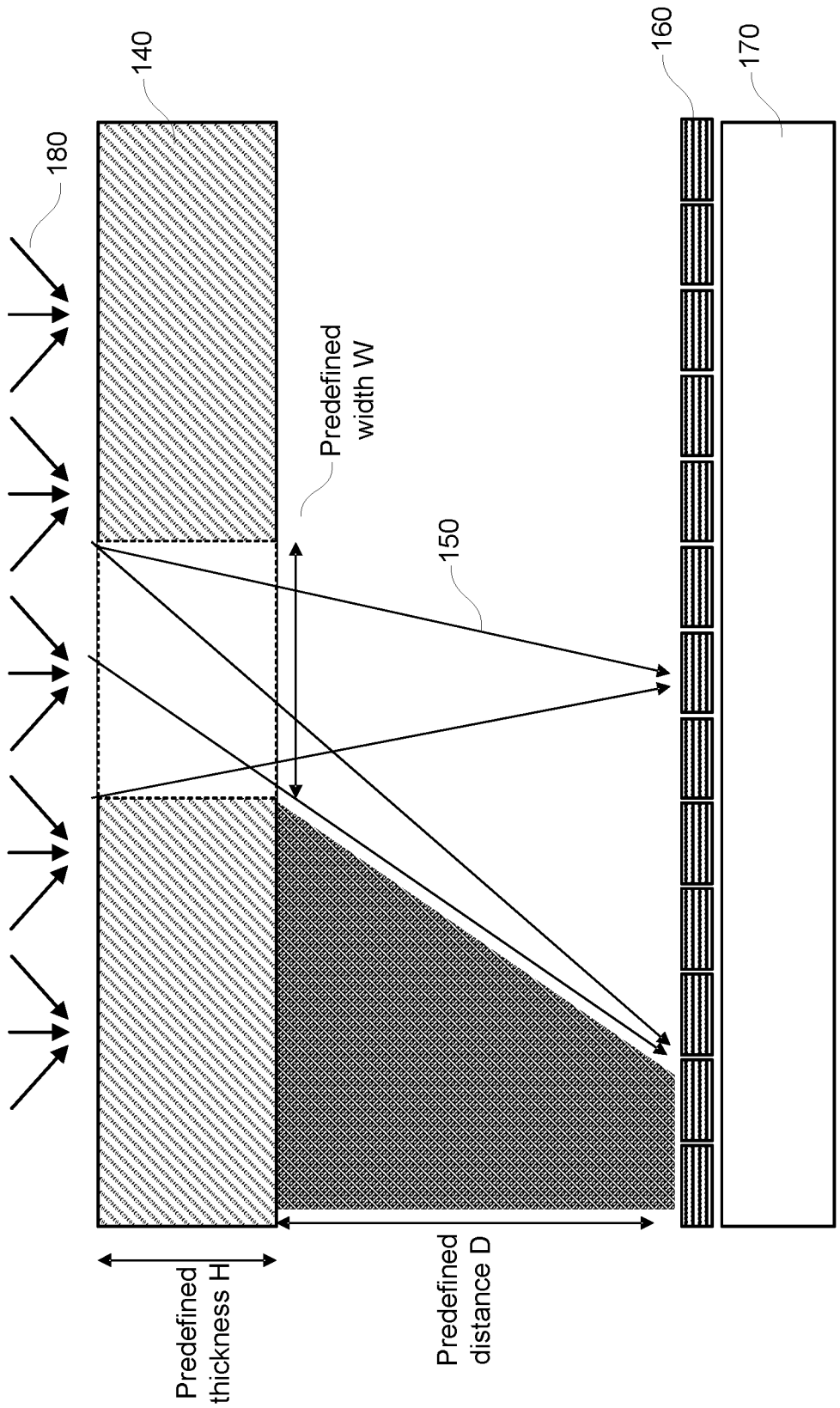
Figure 4A:
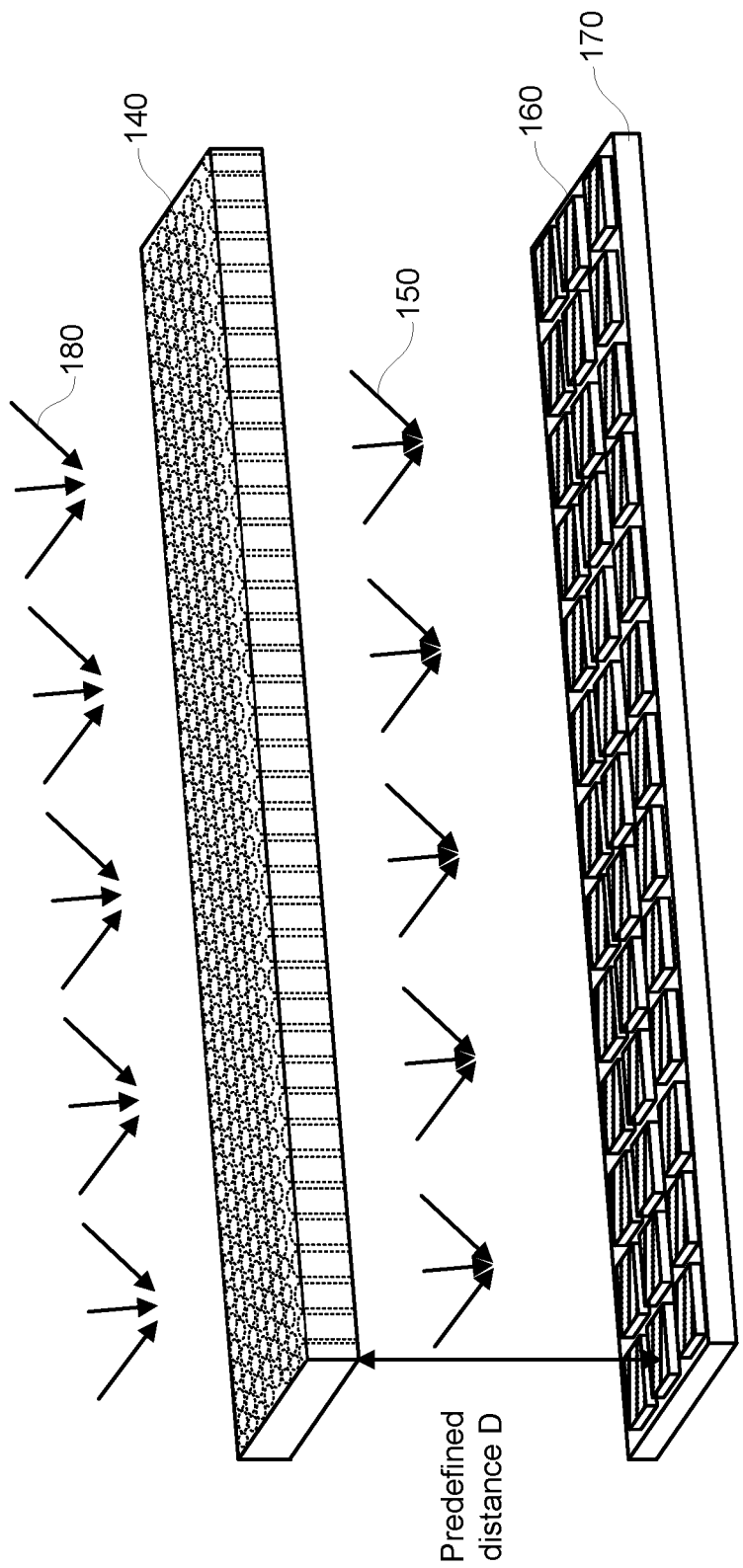
Figure 4B:
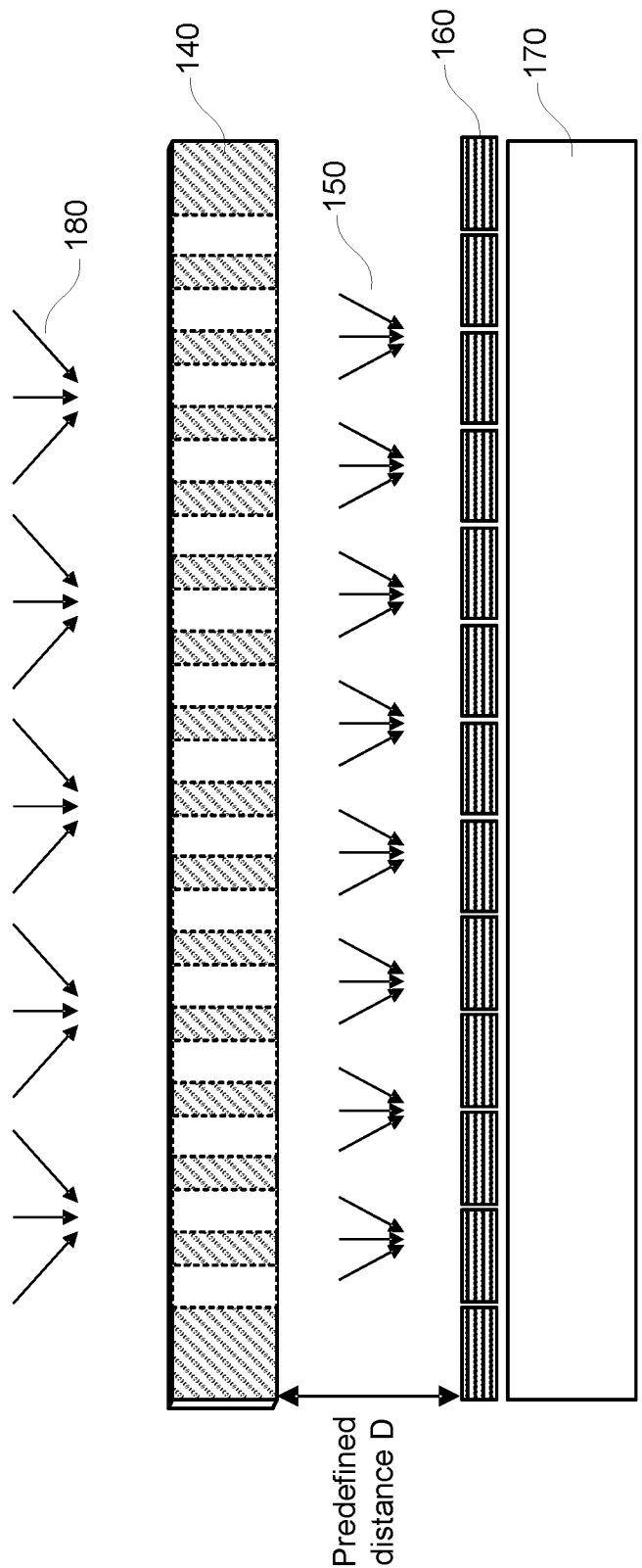
Figure 5:
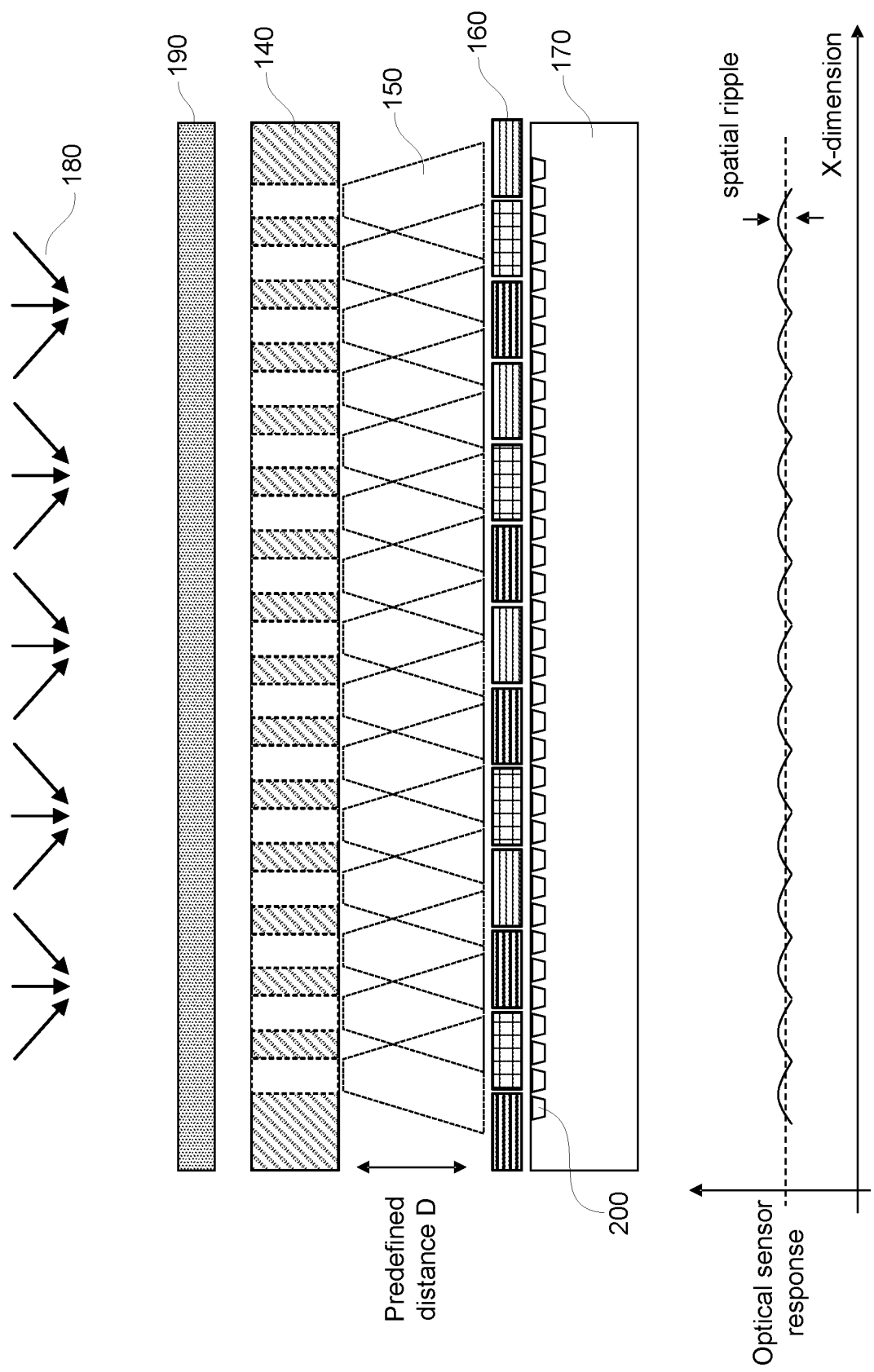
Figure 6:
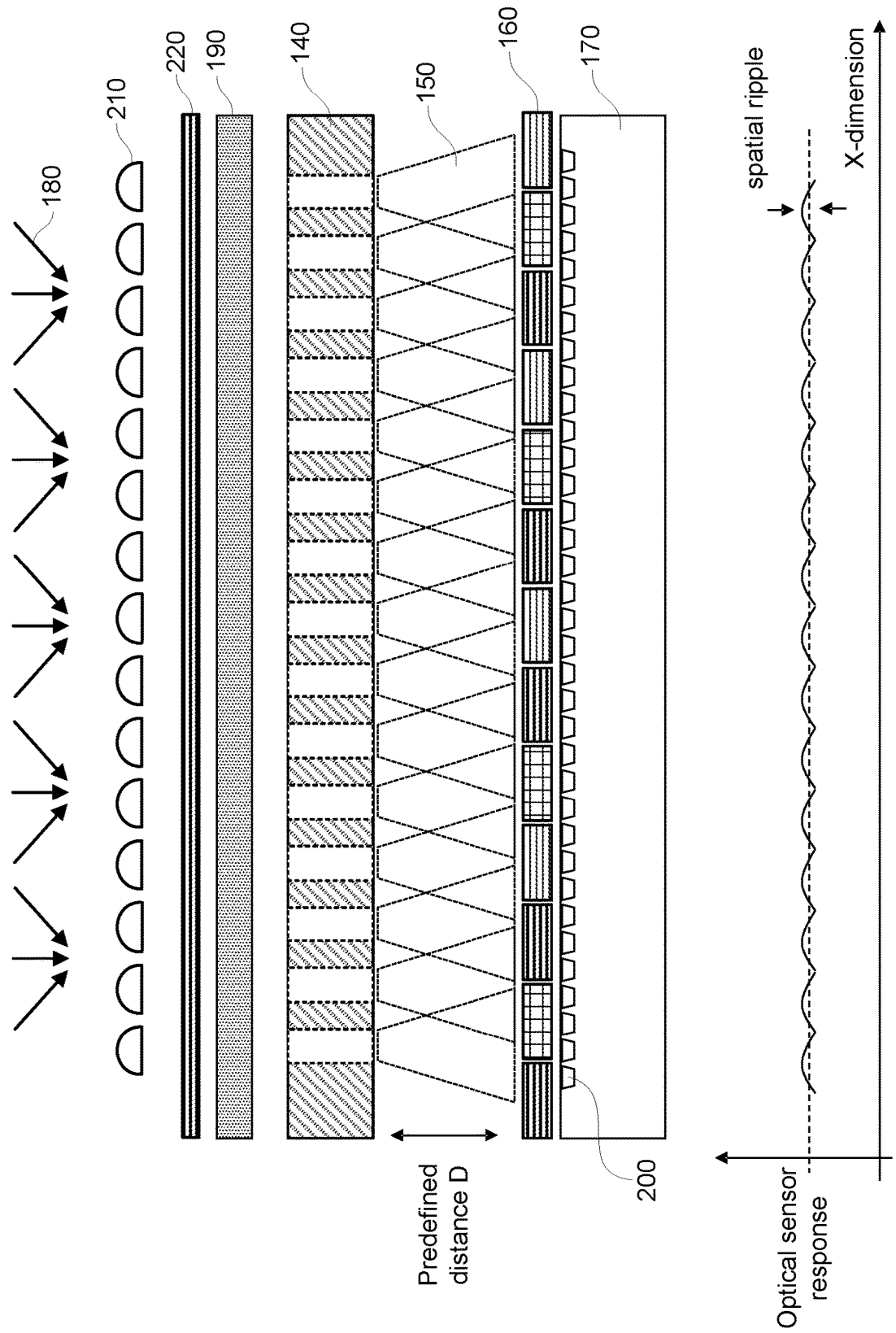
Figure 7:
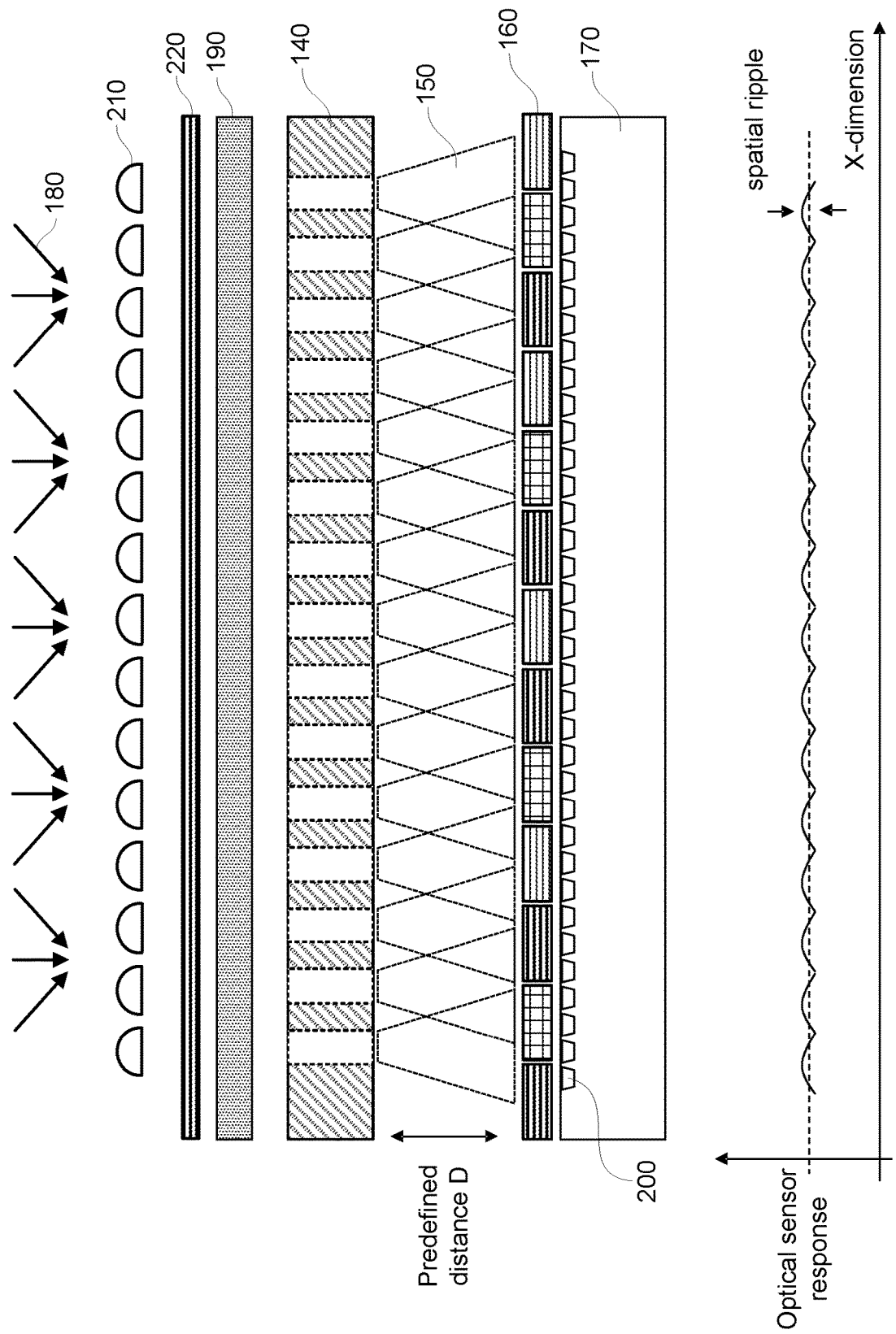
Figure 8:
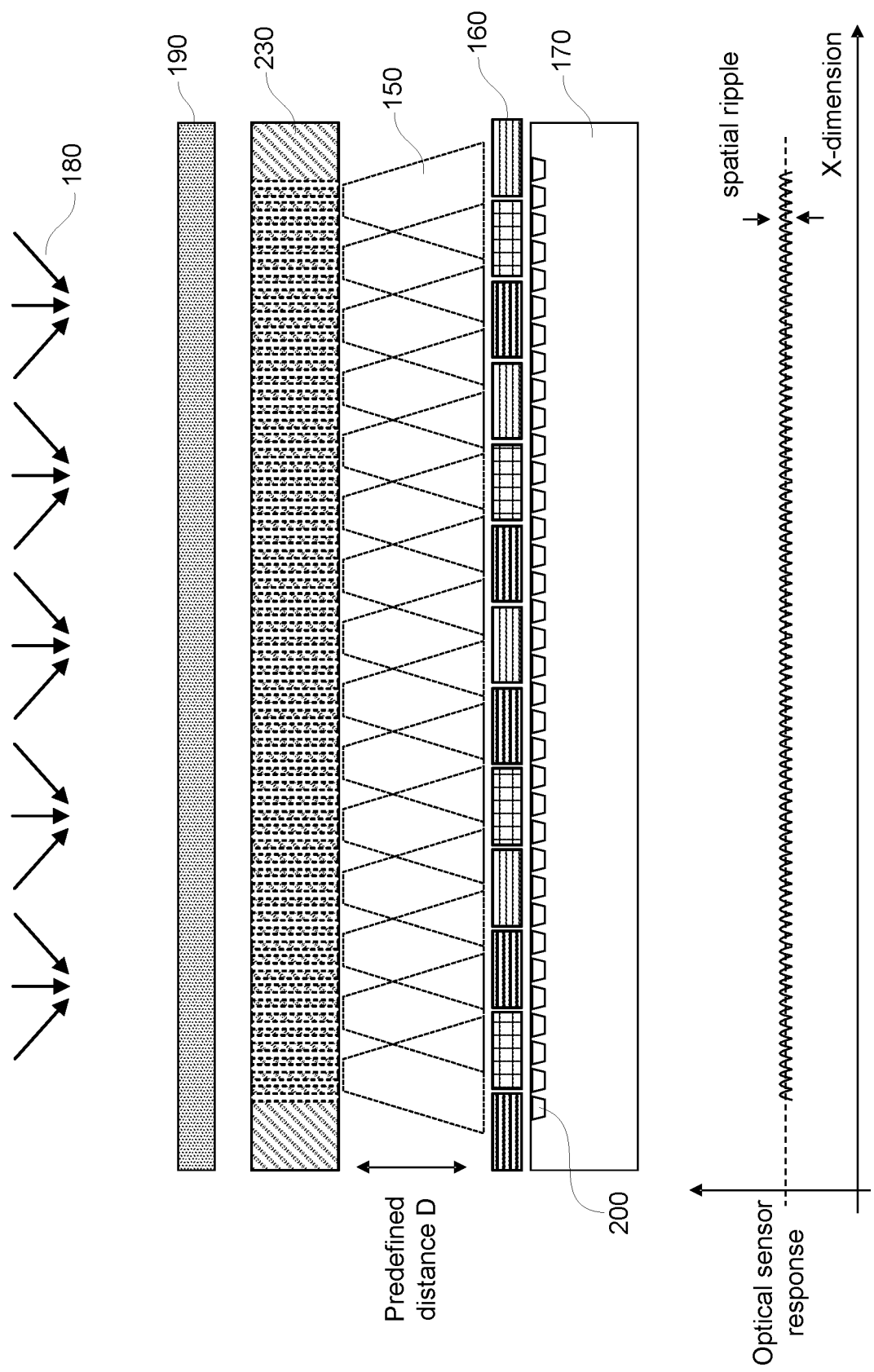
Figure 10A:
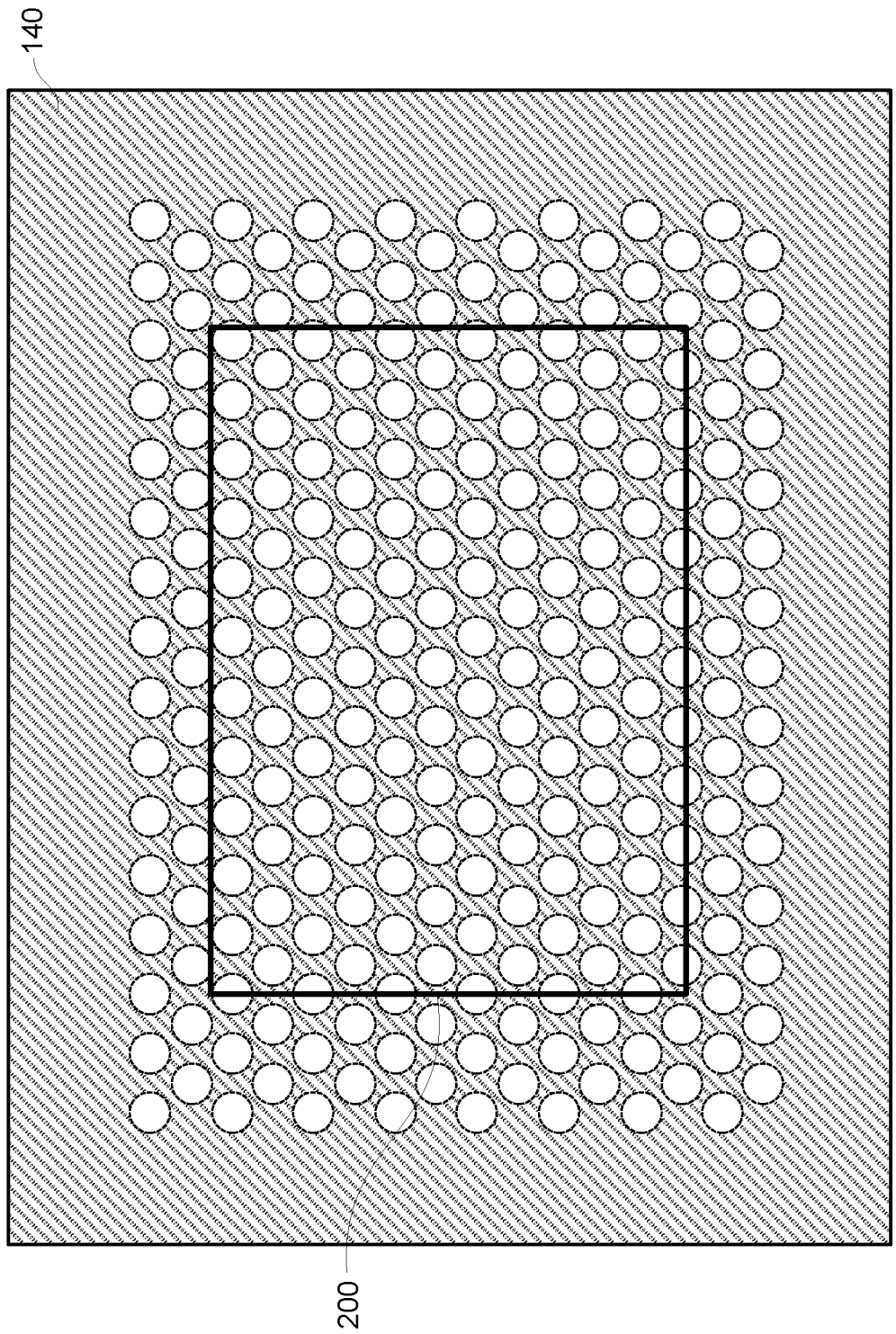
Figure 10B:
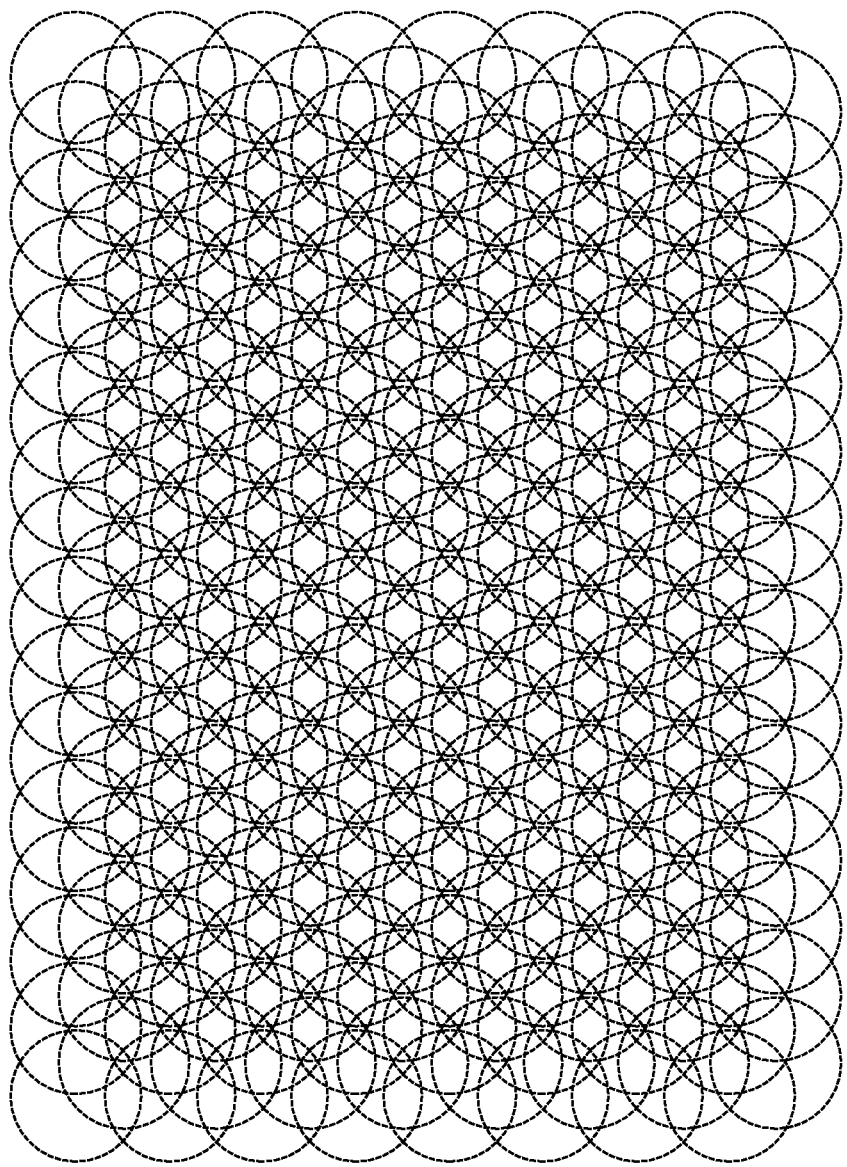
Figure 11A:
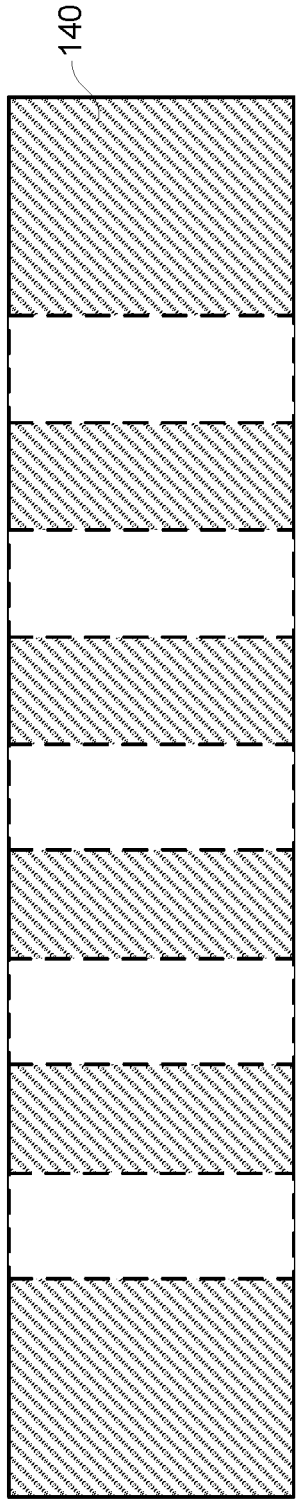
Figure 11B:
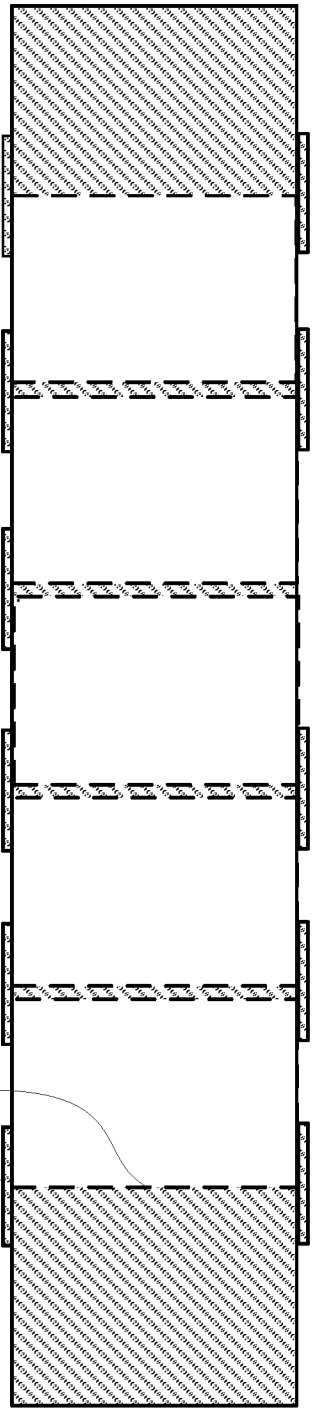
Figure 13:
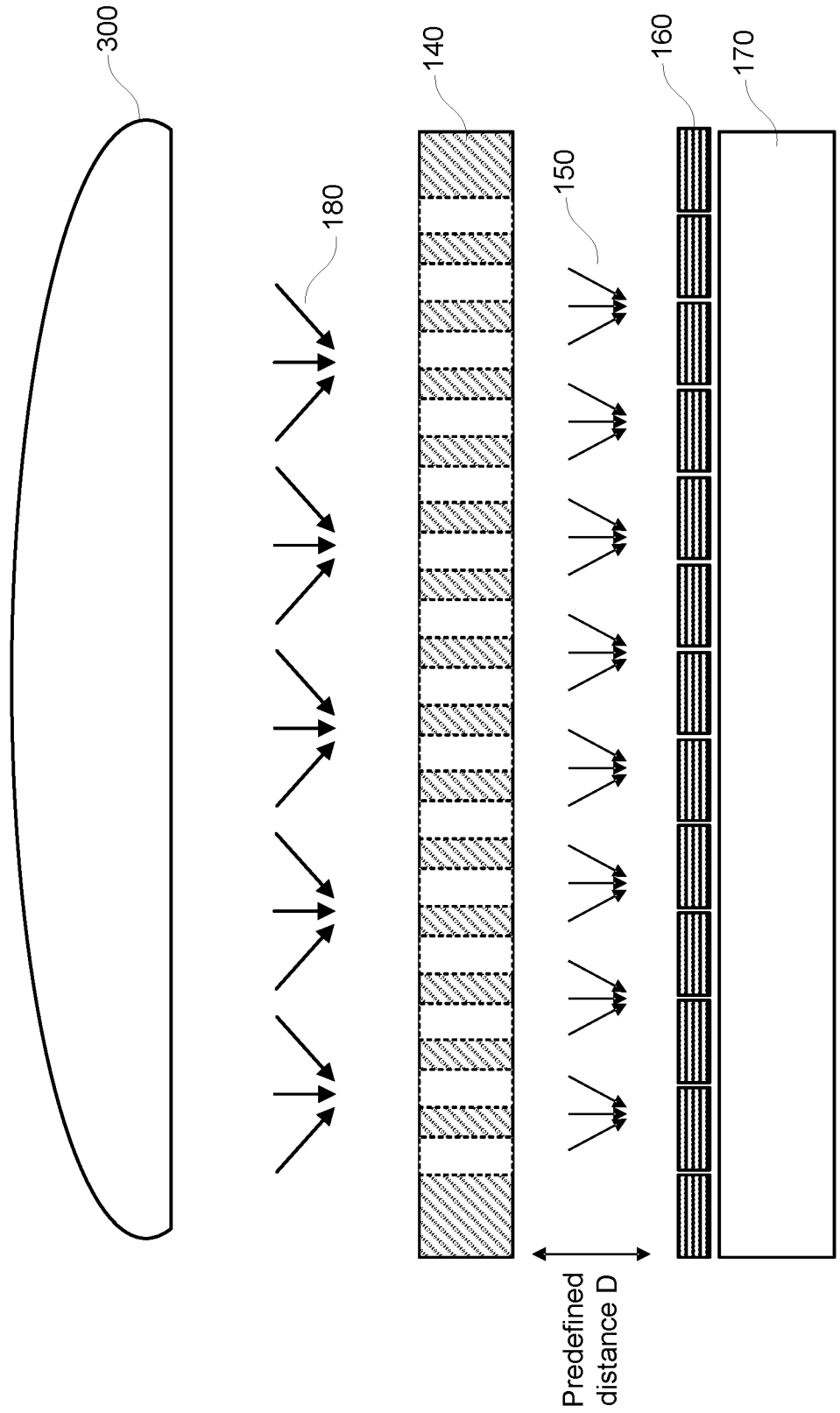
Figure 14:
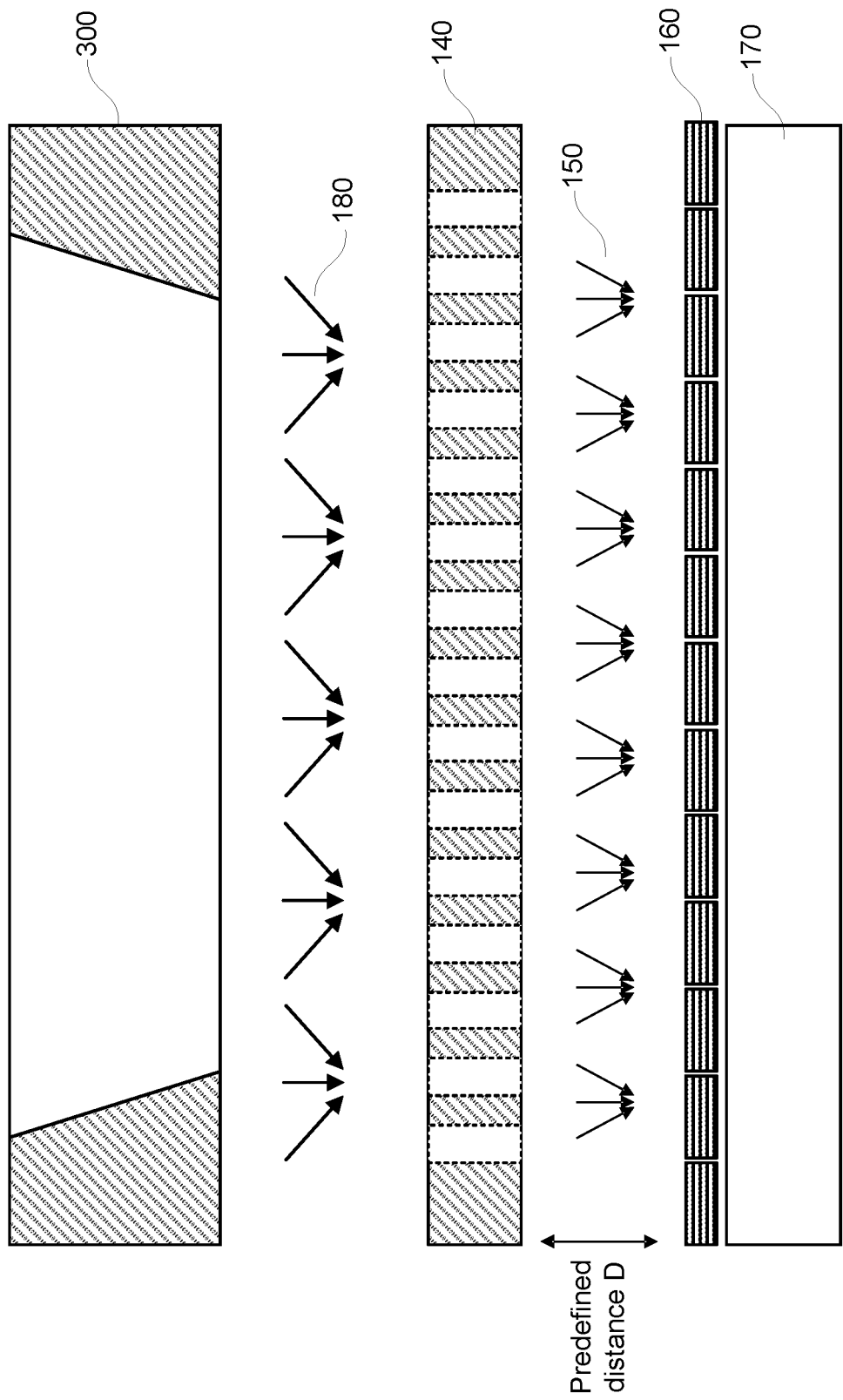
Figure 15:
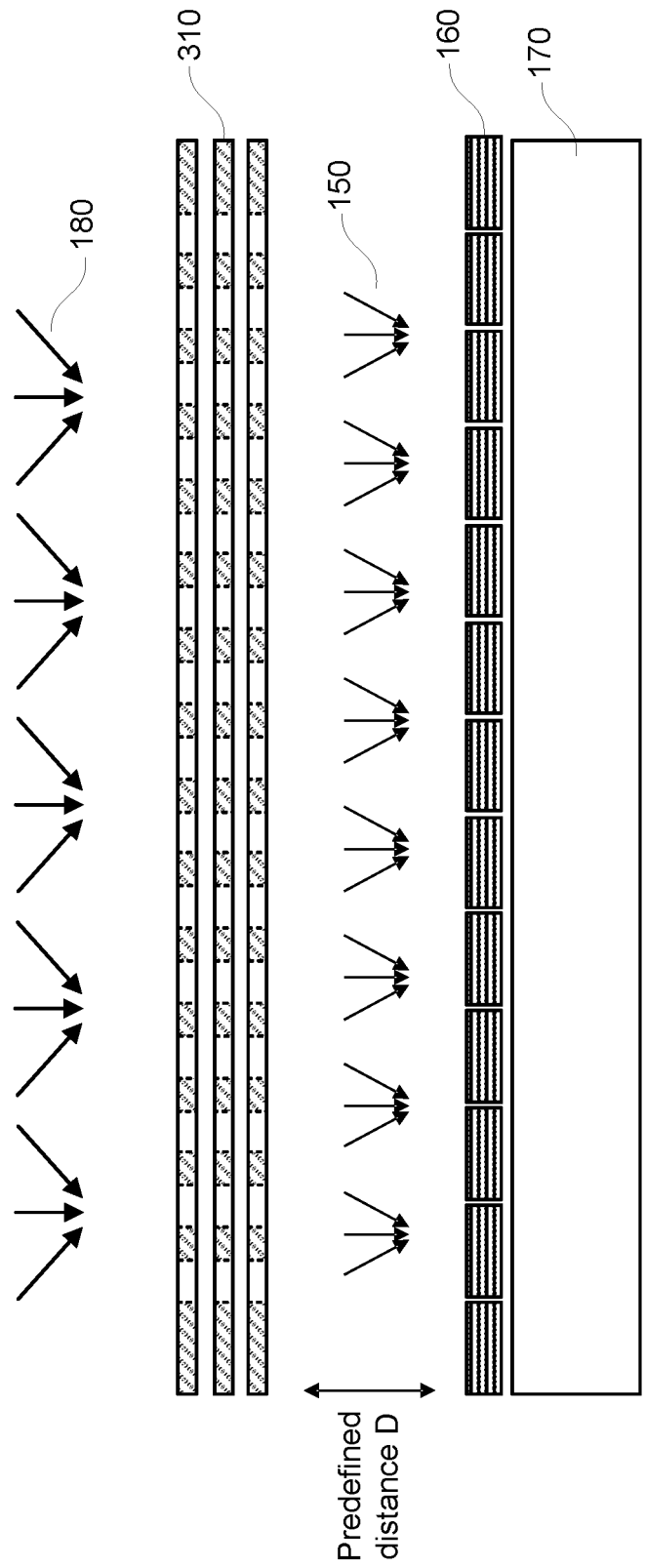
Figure 16:
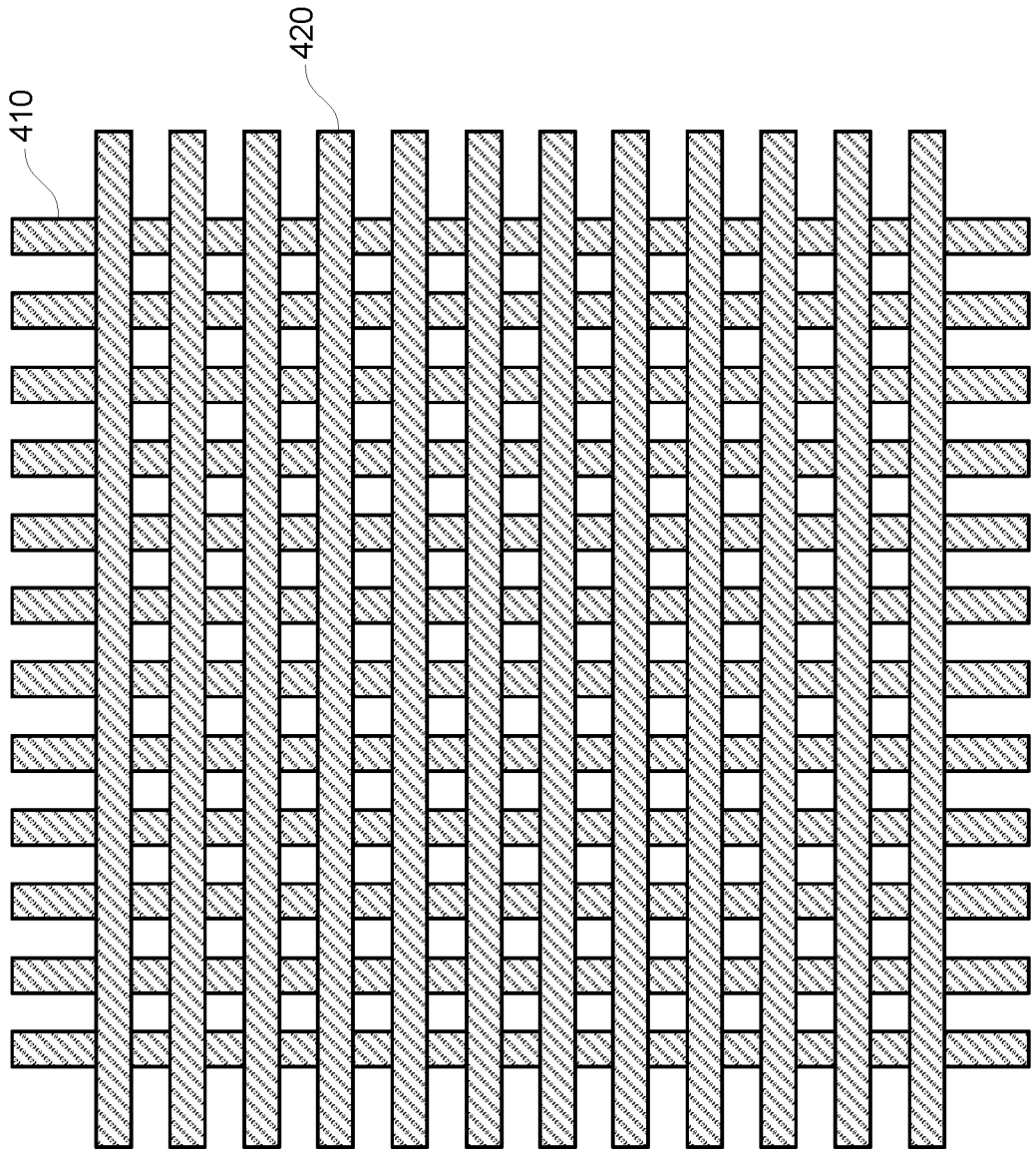
Figure 17C:
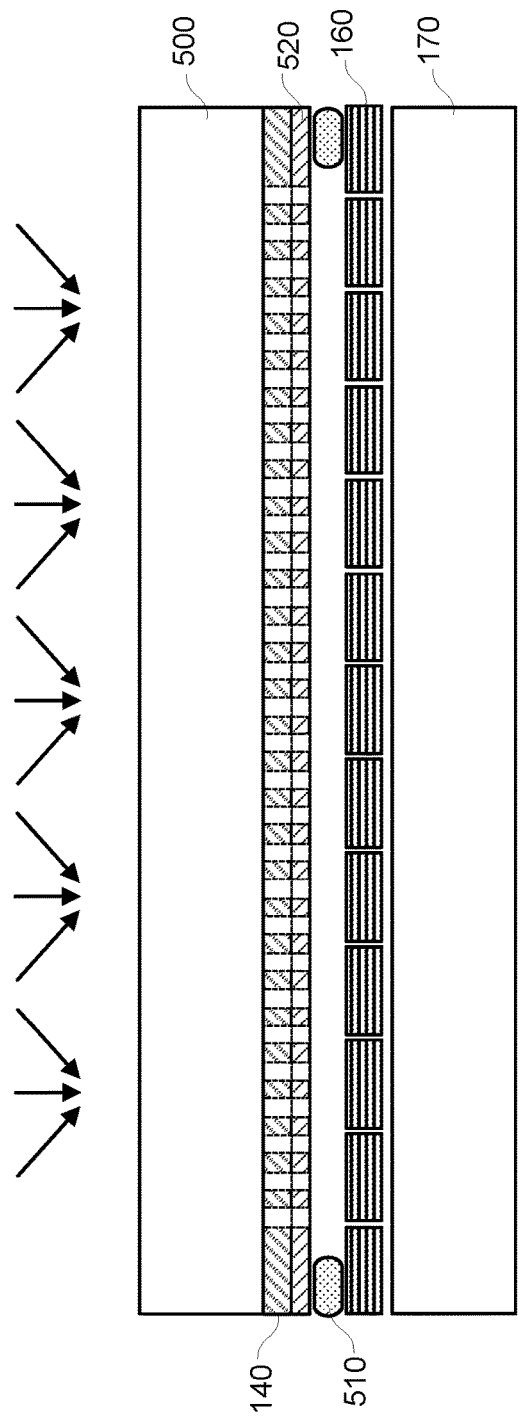
Figure 17D:
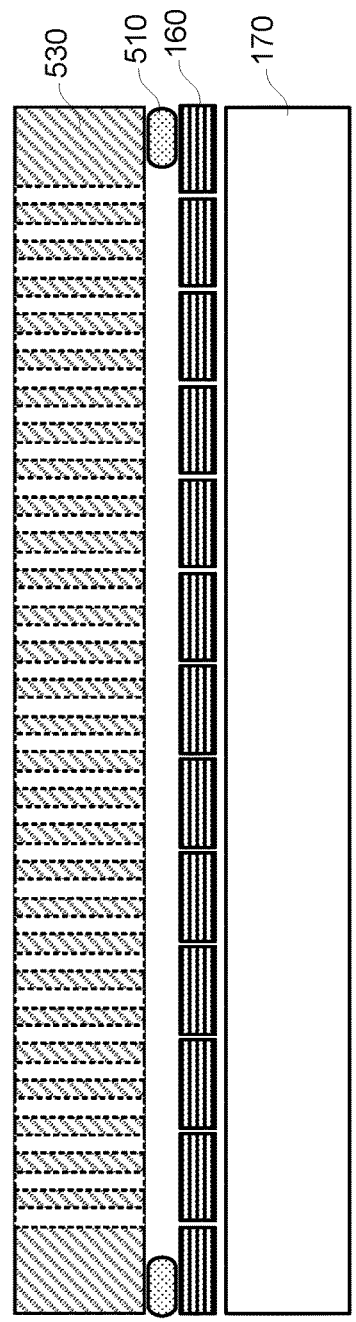
Figure 18:
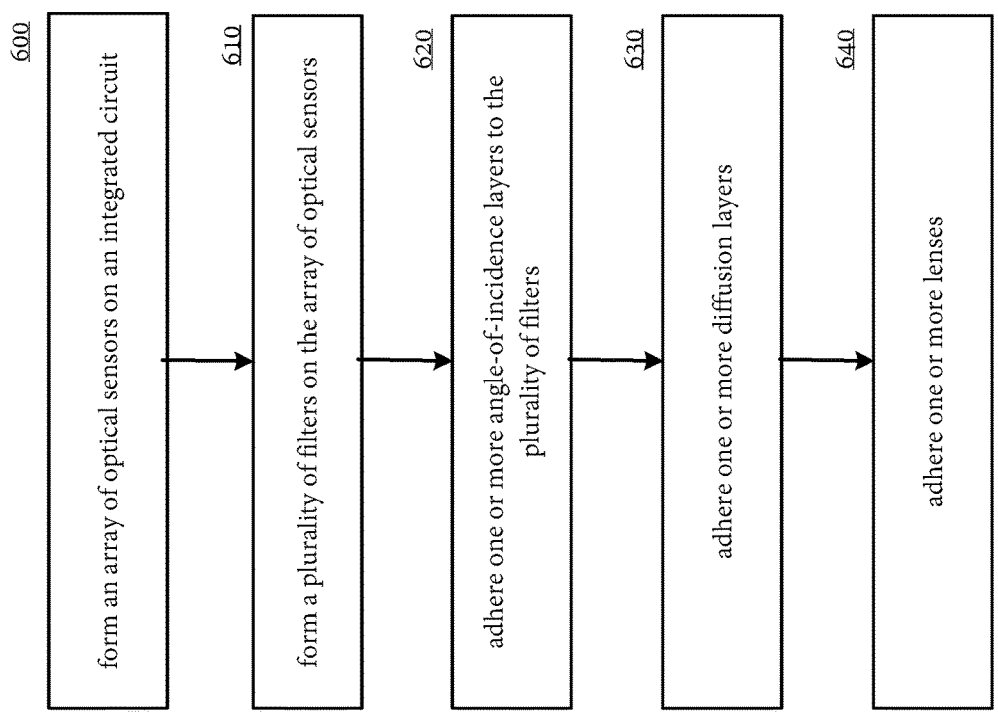

FIG. 3 provides a side-view of an example optical sensor illustrating incident light striking the surface of a portion of optical sensor in accordance with the present invention;

FIG. 4A shows a perspective-view of a portion of an example optical sensor in accordance with the present invention;

FIG. 4B shows a side-view of an example optical sensor in accordance with the present invention;

FIG. 5 shows a side-view of another example optical sensor in accordance with the present invention;

FIG. 6 shows a side-view of another example optical sensor in accordance with the present invention;

FIG. 7 shows a side-view of another example optical sensor in accordance with the present invention;

FIG. 8 shows a side-view of another example optical sensor in accordance with the present invention;

FIG. 9A shows a side-view of another example optical sensor in accordance with the present invention;

FIG. 9B shows another side-view of another example optical sensor in accordance with the present invention;

FIG. 10A provides a top view of an example an angle-of-incidence device with an array of pinhole elements overlaying an optical sensor array in accordance with the present invention;

FIG. 10B illustrates the projection of light from an angle-of-incidence in accordance with the present invention;

FIG. 11A illustrates an example of desired and undesired angle-of-incidence of passed light through a pinhole element of an angle-of-incidence device in accordance with the present invention;

FIG. 11B provides an example of an angle-of-incidence device with an absorptive surface coating and absorptive sidewall coating in accordance with the present invention;

FIGS. 12A through 12F provide examples of pinhole element shapes/structures adapted to reduce the incidence of unwanted reflected light in accordance with the present invention;

FIG. 13 provides a side view of an example optical sensor with an angle limiting element positioned above an angle-of-incidence device in accordance with the present invention;

FIG. 14 provides a side view of another example optical sensor with an angle limiting element positioned above an angle-of-incidence device in accordance with the present invention;

FIG. 15 provides a side view of another example optical sensor with an angle-of-incidence device formed as an angle-of-incidence stack in accordance with the present invention;

FIG. 16 provides a top view of an example optical sensor with an angle-of-incidence stack in accordance with the present invention;

FIGS. 17A-17D provide side views of example optical sensors with various elements integrated with an angle-of-incidence device to form as angle-of-incidence stack in accordance with the present invention; and FIG. 18 provides a method for manufacturing an optical sensor system in accordance with the present invention.

DETAILED DESCRIPTION OF THE INVENTION

Figure 1:
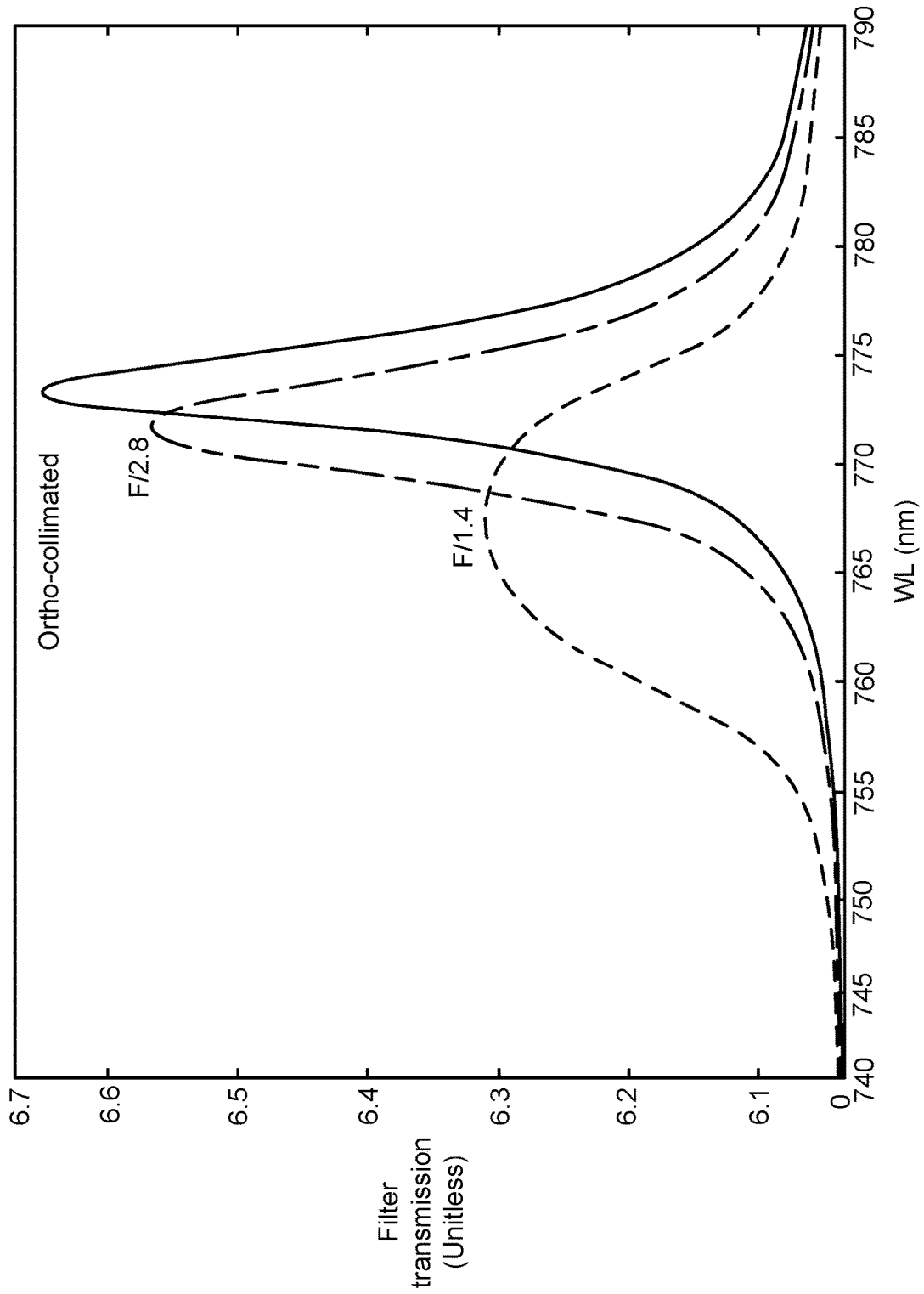
FIG. 1 illustrates filter transmission or response from 740 nm to 790 nm for different f-numbers in accordance with the present invention.

Interference based filters, such as Fabry-Pérot filters, typically have strong angular dependency. When light travels through a Fabry-Pérot filter at an angle of more than plus or minus 10°, for example, the filter response can change, for example, due to shifting to a lower spectral range and a widening filter response. FIG. 1 illustrates the filter transmission or filter response from 740 nm to 790 nm for different f-numbers (f-number being the ratio of the system's focal length to the diameter of the entrance aperture) based on different angles for incoming light.

A collimated beam of light has substantially parallel rays, and therefore will spread minimally as it propagates. For example, a perfectly collimated light beam, with no divergence, would not disperse with distance; diffraction effectively prevents the creation of any such beam. Light can be approximately collimated by a number of processes, for instance by means of a collimator. Perfectly collimated light is sometimes said to be focused at infinity. Thus, as the distance from a point source increases, the spherical wavefronts become flatter and closer to plane waves, which are perfectly collimated. In FIG. 1 a substantially collimated light filter response (an "ortho-collimated" response) is indicated by line A, whereas lines B and C illustrate filter responses with a same chief ray angle (CRA) but different beam f-numbers (i.e. more angles of incidence). (The CRA being a ray from an off-axis object point passing through the center of the aperture of an optical system). In many applications, this angular dependence is problematic and must be attenuated.

Figure 2:
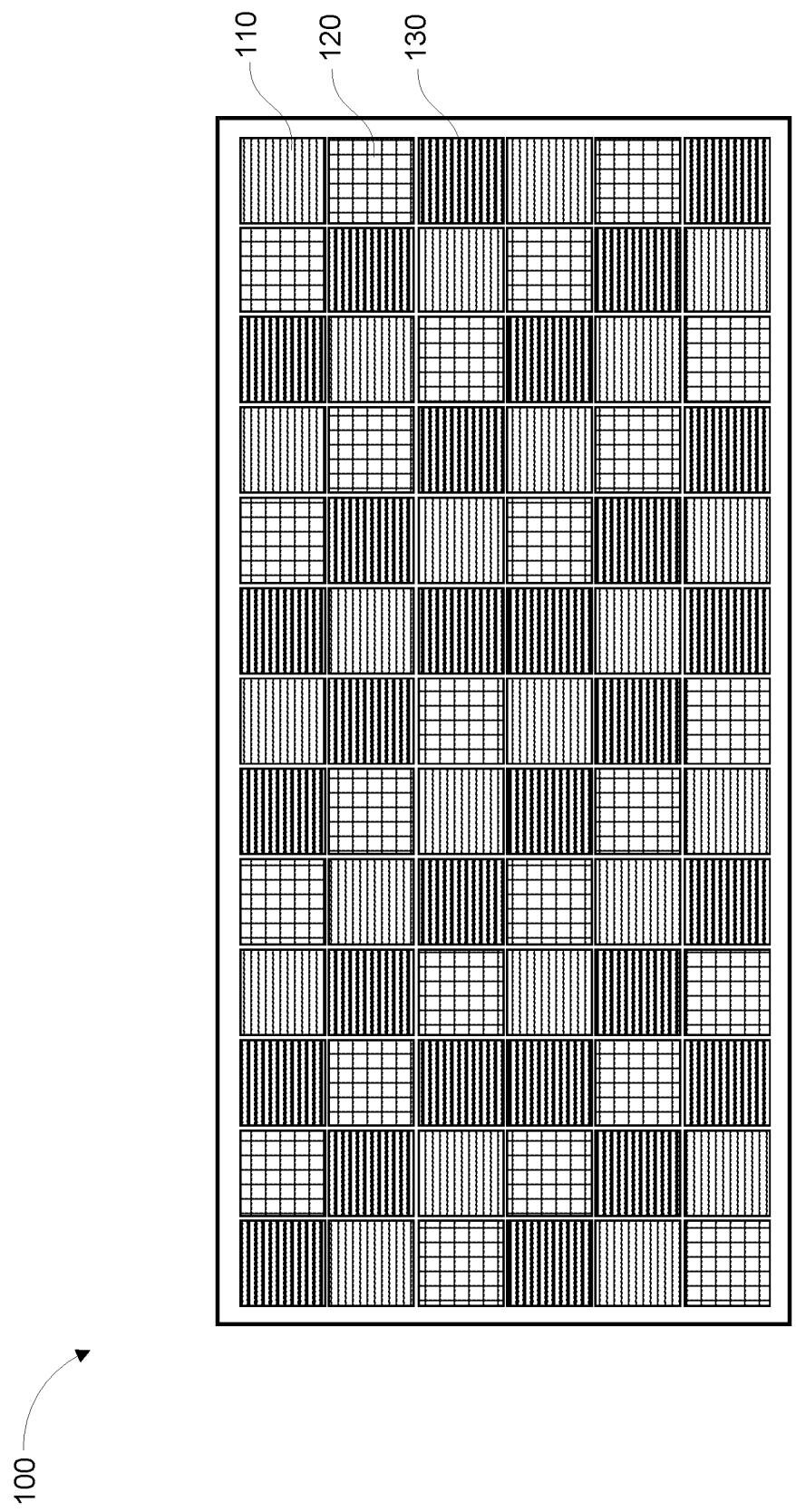
FIG. 2 shows a top-down illustration of an optical sensor overlaid with filters in accordance with the present invention.

FIG. 2 shows a top-down illustration of an optical sensor 100 overlaid with filters 110, 120 and 130 optimized for one of three spectral bands, respectively. As shown filters 110, 120 and 130 repeat as an array across the surface of optical sensor 100. Alternatively, filters 110, 120 and 130 could repeat using a different pattern or even in a random pattern in order to pass filter responses to sensors underlying the filter array. In an example (not shown) spectral bands exceeding 3 could be used to overlay sensors as desired in almost any practical configuration. In an embodiment, optical sensor 100 is an example of a spectral sensor useful for diffuse optical spectroscopy, where arrays of spectral filters are associated with optical sensors to provide diffuse spectral sensing.

Diffuse optical spectroscopy can be especially sensitive to the uniformity and stability of the angle-of-incidence of light striking sensors, thus the angle-of-incidence of light striking a sensor array is preferably unmodulated, in a relative sense, when the angle-of-incidence of light striking the surface of spectral filter changes. In an example, when each spectral band of a filter array, such as filters 110, 120 and 130 (together constituting a set of spectral bands or spectrum), is spatially distributed on the surface of a sensor array, the spatial distribution can have a significant effect on the performance of a diffuse optical spectrometer. This is at least partially due to the reality that when a particular filter passes light of different intensity, the reconstructed spectrum striking a sensor array will be deformed, or "colored". A colored spectrum can be compensated for (calibrated) electronically, however, if the uniformity of light passing through the filter changes over time, or if the CRA or angularity of the incident light changes, a reconstructed spectrum will be unstable. In such an example a reconstructed spectrum will appear to have a change in spectral response when on the angle-of-incidence of the incident light striking the optical sensor has changed.

Diffuse optical sensors can benefit from a reduction on the effect on the sensor of a change to the angle-of-incidence of light striking the sensor array and from ensuring that the uniformity of light across the sensor is substantially independent of the angle-of-incidence of light striking the sensor array. Accordingly, in order to provide a stable filter response for an optical sensor, it is preferable to limit the angle-of-incidence of incident light striking the surface of the optical sensor. One method of providing a stable filter response is to ensure that all optical sensors and therefore all optical filters are subject to substantially the same change in angular response, so that the effect on all sensors is uniform. This ensures that the spectrum of diffuse optical spectroscopy is not subject to substantial "recoloring".

In one embodiment, a lens or a lens system can be used to collimate light striking a sensor and/or filter array. Lens systems generally require a relatively large form factor, especially considering the large f-numbers associated with spectral filters (for example f/2 or higher). Lens systems can also be relatively thick and require an expensive optics stack. Lenses and/or lens systems can be likewise sensitive to changes in the angle-of-incidence and CRA of incident light striking the optical sensor through the lens, resulting in a non-uniform change of angularity across the sensor array. These non-uniform changes of angularity can affect different sensors and their spectral response differently. Additionally, since a lens or lens system will necessarily focus the incident light on different parts of a "scene" the attributes of the different parts of the scene will be projected onto different parts of a sensor array, resulting in a non-diffuse spectral response.

In another example embodiment, a pinhole device may be used on the surface of a sensor. FIG. 3 provides a side-view of an example optical sensor illustrating incident light 180 striking, for example, the surface of a portion of optical sensor 100 from FIG. 2 through such a pinhole device. In the example, an angle-of-incidence device 140 (a device capable of narrowing or directing incident light as it passes through the angle-of-incidence device) of predefined thickness H passes conditioned light 150 as it passes through an aperture of predetermined width W of angle-of-incidence device 140. In an example, the aperture is an opening, open space, or a filled open space that can have shapes that include, but are not limited to, circular, triangular, square, star, hexagonal, octagonal and even irregular shapes.

In an example, incident light 180 strikes the surface of the angle-of-incidence device 140, which intercepts light striking the surface beyond a certain angle, as dictated by predefined width W and predefined thickness H of angle-of-incidence device 140. Angle-of-incidence device 140 effectively "conditions" incident light 180 to produce conditioned light 150 striking the surface of filter array 160. Predefined distance D is the distance between the lower surface of angle-of-incidence device 140 and effectively defines the area exposed to conditioned light 150, as well as the area outside the area exposed to conditioned light 150. As discussed in FIG. 3, filter array 160 overlays sensors, illustrated in FIG. 3 as sensor array 170.

The resultant sensor example illustrated in FIG. 3 indeed limits the target angles that pass to the surface of a filter array, however if the sensor includes a large area it will be subject to a large variation in CRA across the surface of the sensor device 100. Additionally, depending on the angle-of-incidence of incident light striking the surface of the sensor device 100 shading may be evident on the filter array 160, which can result in nontrivial modulation of the spectral response for the sensor device 100. Finally, due to geometrical limitations the combined optics of such an embodiment would result in a thick stack of elements. For example, predefined distance D is determined based on a desired angle-of-incidence, thus the pinhole (such as the aperture defined above) has a predefined width W and a predefined thickness H. Options for the shape of the pinhole of FIG. 3, as well as the collimated pinhole elements that follow in FIGS. 4-15 below, include, but are not limited to, circular, triangular, square, star, hexagonal, octagonal and even irregular shapes as dictated by manufacturing/fabrication processes. For example, an irregular structure may be a by-product of a DRIE or wet-etch process, where the irregular structure provides a rough surface that enhances/improves the absorption of incident light 180 striking the sidewalls of the collimated pinhole elements.

FIG. 4A shows a perspective- of a cross sectioned portion of an example optical sensor that replaces the single pinhole of FIG. 3 with an angle-of-incidence device 140 comprising an array of collimated pinhole elements (collimating elements) disposed a predefined distance D above filter array 160. As will be explained further below, the angle-of-incidence device 140 can be configured to limit the maximum angle of light passing through to, for example, the filter array 160 and optical sensors 200. In effect, the thickness of the angle-of-incidence device 140, along with the aperture size of the collimating elements, is selected based on the filter response(s) of the filter elements in filter array 160. Accordingly, the angle-of-incidence device 140 is configured to provide a predetermined distribution of light angles exiting the angle-of-incidence device 140, where the predetermined distribution of light angles matches the desired filter response for the filter array 160.

In a specific example, filter array 160 is formed of individual filter elements aligned (associated) with individual optical sensors of the optical sensor array 170. In another specific example, filter array 160 is formed of individual filter elements with a plurality of the filter elements being aligned with a single optical sensor of the optical sensor array 170. In an example, filter array 160 is formed with individual elements separated by a border or demarcation between the elements in the filter array 160. In yet another specific example, filter array 160 is formed with individual elements formed contiguously in the filter array 160. Accordingly, although the individual filter elements of filter array 160 are illustrated as segregated elements in FIG. 4A, in practice the individual filter elements can be formed directly next to each other, separated by a border between the individual filter elements or a combination of both (i.e. some separated with other directly abutting each other).

FIG. 4B shows a side-view of the portion of the example optical sensor of FIG. 4A. In a specific example of implementation, the collimating elements of the angle-of-incidence device 140 are located a predefined distance D above filter array 160, so that conditioned light 150 produced by an individual collimating element of collimating array of angle-of-incidence device 140 overlaps conditioned light 150 produced by adjacent collimating elements of collimating array of angle-of-incidence device 140 as it strikes filter array 160. In an example, overlapping conditioned light can serve to provide an averaging effect for light produced from individual collimating elements and thereby an averaging effect on the individual filter elements of filter array 160 and subsequently on individual sensors of sensor array 170. In another example, the collimating elements of angle-of-incidence device 140 are located in substantially direct contact with the filter array 160, such that each individual sensor element of sensor array 170 receives conditioned light through the angle-of-incidence device 140 and filter array 160 that is substantially identical as that of adjacent sensor elements, assuming the filter elements of filter array 160 are substantially identical. In the example, any variability from the angle-of-incidence device 140 is assumed to be effectively equal, such the spectrum of light received by the individual sensor elements is not "colored" by the angle-of-incidence device 140.

In a specific example of implementation, angle-of-incidence device 140 can be implemented as an opaque layer, with each collimating element of the array of collimating elements comprising a void in opaque layer. In an example, the collimating elements can be formed using lithographic processing methodologies, such as deep reactive-ion etching (DRIE), ion milling and wet chemical etching, either alone or in combination. In another specific example of example of implementation, the collimating elements can comprise an air void, and in another example, the void can comprise a solid material configured to pass light in a predetermined wavelength. In an example, the solid material comprised in the collimating elements can be formed separately from the opaque layer of the angle-of-incidence device 140, with the opaque layer being formed in a secondary process around the solid collimating elements. In yet another example, the angle-of-incidence device 140 can be formed in a bulk process, with each angle-of-incidence device 140 sliced from a larger precursor material and applied to the optical sensor 100 in a mechanical process. In an example of operation, the slicing of the precursor material can comprise sawing with a blade or laser cutter and can be followed by a post process, such as chemical mechanical polishing (CMP), before being applied to the optical sensor 100.

In another example of implementation, angle-of-incidence device 140 can be formed of a material predetermined to result in a rough surface on the sidewall of the collimating elements. For example, angle-of-incidence device 140 can comprise an opaque layer formed with a sputter deposition process adapted to produce (relatively) large chunks of material that will etch unevenly to produce a rough surface. Example sputtering methods include ion-beam sputtering, reactive sputtering, high-target-utilization sputtering, ion-assisted deposition, high-power impulse magnetron sputtering and gas flow sputtering.

FIG. 5 shows a side view of another example optical sensor that includes a diffusion layer 190 proximal to the collimating elements of angle-of-incidence device 140. A diffusion/diffusing layer or diffuser (also called a light diffuser or optical diffuser) can be any material that diffuses or scatters light. Diffused light can be provided, for example, using any translucent material, including, but not limited to, ground glass, teflon, opal glass, and greyed glass, located between a light source and the diffused light. In the example, the diffusing layer 190 effectively scrambles incident light 180 before it is received at angle-of-incidence device 140, such that light passed by angle-of-incidence device 140 is averaged between incoming angles of incident light 180. In the example, conditioned light 150 is illustrated as "cones" of light as it exits the collimating array of angle-of-incidence device 140.

In an example, the cones of light overlap as they strike filter array 160 and, thus, the responses from individual optical sensors of optical sensor array 200 can overlap as well. The overlapping responses from the optical sensors of optical sensor array 200 can result in spatial ripple on the individual sensors, as illustrated in FIG. 5. In an example, resultant spatial ripple can be attenuated to meet the requirements of a given optical sensor device. In another example, the spatial ripple can be additionally subject to variability in the CRA of incident light 180 striking the sensor and/or the angularity of light rays in incident light 180. In yet another example, another diffusion layer that is weaker than diffusion layer 190 is located between angle-of-incidence device 140 and conditioned light 150. In an example, diffusion layer 190 provides for conditioned light 150 with more consistent uniformity. In an example, diffusion layer 190 is adapted to provide limited diffusion, so that uniformity is achieved without increasing the angles in conditioned light 150 sub optimally.

FIG. 6 shows a side view of another example optical sensor that includes lens array 210 proximal to the diffusion layer 190 of FIG. 5. Each lens of lens array 210 can be located so as to focus incident light 180 on the angle-of-incidence device 140. By focusing incident light 180 at individual collimating elements the efficiency of optical sensor 200 increases, since the amount of incident light 180 reflecting off the surface of diffusing layer 190 is reduced.

Returning to FIG. 2, in an embodiment, filters 110, 120 and 130 are optimized for one of three spectral bands, but they are scrambled relative to each other as they are redundantly repeated over sensor array 170. In an example, the redundant filters 110, 120 and 130, together with the redundant optical sensors (such as optical sensors 200 from FIG. 6) associated with the redundant filters 110, 120 and 130 can be used to scramble out the shading effects and/or coloring on the optical sensor discussed with regard to FIG. 2.

FIG. 7 shows a side view of another example optical sensor that includes a rejection filter 220 proximal to the lens array 210 of FIG. 6. When incident light 180 includes light frequencies outside the spectrum desired for optical sensor 200, rejection filter 220 can be designed to remove the out-of-band light. In an example, the addition of rejection filter 220 can improve the efficiency and/or performance of optical sensor 200.

FIG. 8 shows a side view of another example optical sensor, wherein the angle-of-incidence device 140 includes a fiber-optic plate 230 instead of collimating pinhole elements. Fiber-optic plates (sometimes also called fiber faceplates) are transparent plates consisting of many optical fibers. Fiber-optic plates can provide one-to-one image transfer from the input face (the top surface in FIG. 8) to the output face (the surface facing filter array 160) by connecting many input points to corresponding output points. Fiber-optic plates can contain smaller and smaller fibers for achieving a correspondingly higher spatial resolution, such that millions of fibers can be contained in such a plate.

FIG. 9A shows a side view of an example optical sensor with angle-of-incidence device 140 directly proximal to the filter array 160, such that there substantially no space between angle-of-incidence device 140 and filter array 160. In an example, pinhole elements of angle-of-incidence device 140 are aligned with individual sensor elements of sensor array 170. In another example, multiple pinhole elements of angle-of-incidence device 140 are aligned with a single sensor element of sensor array 170. In yet another example, a single pinhole element of angle-of-incidence device 140 is aligned with a plurality of individual sensor elements of sensor array 170. In FIG. 9B angle-of-incidence device 140 is between filter array 160 and sensor array 170 such that there substantially no space between angle-of-incidence device 140 and filter array 160, and substantially no space between angle-of-incidence device 140 and sensor array 170. The arrangement of optical sensor elements in FIGS. 9A and 9B, as well as in the other figures provided are intended to be illustrative only; accordingly, sensor elements could be arranged in virtually any manner and the elements could likewise be spaced as needed to accommodate performance and manufacturability requirements.

FIG. 10A provides a top view of an example angle-of-incidence device 140 with an array of pinhole elements overlaying a smaller optical sensor array 170. In an example, optical sensor array 170 is slightly smaller than the array of pinhole elements included in angle-of-incidence device 140. In an example, each pinhole element in angle-of-incidence device 140 is aligned to an individual element on optical sensor array 170. In an alternative example the output of angle-of-incidence 140 is designed to overlap and need not be aligned to a sensor element of optical sensor array 170. In yet another example, angle-of-incidence device 140 is a fiber-optic plate or another suitable structure adapted to provide conditioned light 150 on optical sensor array 200. FIG. 10B illustrates the projection of light from an embodiment of FIG. 10A. With reference to FIGS. 4-8, angle-of-incidence device 140 is located predetermined distance D from filter array 160, which is located proximal to optical sensor array 170. In an example, the projected light from each collimating element of angle-of-incidence device 140 overlaps the projected light from one or more adjacent collimating elements.

FIG. 11A illustrates an example of a desired angle-of-incidence of passed light through a pinhole element of angle-of-incidence device 140, where the angle-of-incidence of passed light is within a desired angle for use with an optical sensor 100. Also illustrated is an angle-of-incidence that produces undesired reflected light off the sidewall of a pinhole element of angle-of-incidence device 140. This undesired reflected light can be, for example, the result of specular and/or diffuser reflection onto the inner sidewall of the pinhole element. This undesired reflected light can degrade the efficiency and/or performance of optical sensor 100, as discussed above.

FIG. 11B provides an example of an angle-of-incidence device 140 with an absorptive or anti-reflective surface coating 240 and/or absorptive sidewall coating 250 for attenuating or substantially eliminating the undesired reflected light discussed with regard to FIG. 11A. Example absorptive or anti-reflective coatings include any material with absorptive properties capable of reducing the reflection of incident light. Example materials include, but are not limited to, low specularity coatings, carbon nanotubes, oxide coatings, powder coatings, silicon nitride and the like. In an example, absorptive coatings can be applied as a spray, deposited in single or multiple steps and/or passivated to provide a micro coating of acceptable coverage considering the aspect ratio of the pinhole element sidewalls and the intended performance of the coating. In another example the anti-reflective coating is a byproduct of a DRIE etch process.

FIGS. 12A through 12F provide examples of pinhole element shapes/structures adapted to reduce the incidence of unwanted reflected light. In each example the pinhole shape is adapted with either a specific angle, or a combination of angles or even a curved shape. The resultant pinhole structure can be used as is, or may be coated, deposited or passivated with one or more of the absorptive or anti-reflective coatings described above. Additional examples include treatment by etching or some other methodology to render a rough surface or any other method capable of diffusing light of an undesired angle. In another example, the pinhole sidewall can be treated to render a highly reflective surface that can then be directed away from the detector elements.

In an example, the pinhole structure can be created in a silicon wafer using deep reactive-ion etching (DRIE), where, in an example, the DRIE creates a scalloped surface (illustrated in FIG. 12C) on the pinhole sidewall, which in turn can reduce undesired reflected light, via a passivation effect. In another example relevant to FIGS. 12A-12E, the angle of the pinhole sidewalls is adapted such that the reflected light of angle higher than a predetermined amount is reflected away from the bottom of the pinhole. In another example, absorbing coatings (such as that discussed in 11B, above) define pinholes on the top and bottom of a cap or lid, such that only light of a desired angle can pass through the pinhole element. In another example, pinhole element sidewalls can be adapted to block light greater than a desired angle from exiting the pinhole element.

Various options can be used to manufacture an angle-of-incidence device 140. Material options include, but are not limited to, plastic, metal, ceramic, semiconductor (plate or substrate). Semiconductor options include, but are not limited to Si, SiGe, and Ge, and an angle-of-incidence device can be formed using any of drilling, laser drilling, etching (such as DRIE or wet chemical), hot embossing, micro 3D printing or any other suitable method, including imprinting technology or deposition technologies. The angle-of-incidence can also comprise multiple multilayer structures or apertures, film stacks, and structures integrated with the sensor back-end-of-line. The angle-of-incidence can also consist of an orthogonal grid of reflective or absorbing plates, lines or beams, or a stack of such structures, examples of which are illustrated in FIGS. 15 and 16, below. Options for angle-of-incidence device 140 manufacture include mounting a previously formed structure on a wafer with multiple sensor devices 100, etched in place after affixing to sensor devices 100 on wafer, or affixed as the formation of a package for sensor device 100. Options also include forming and/or affixing the angle-of-incidence device 140 during system assembly.

FIG. 13 provides a side view of an example optical sensor with an angle limiting element positioned above angle-of-incidence device 140 directly proximal to the filter array 160, such that there substantially no space between angle-of-incidence device 140 and filter array 160. In an example, primary angle-limiting device 300 positioned above the angle-of-incidence device in an optical sensor stack. In an example, the primary angle-limiting device functions as a light confinement element to "pre-limit" or "pre-condition" light before it reaches the first surface of angle-of-incidence device 140, so that incident light 180 is at least partially constricted. For example, if the primary angle-limiting device 300 is a lens, as depicted in FIG. 13, the angle of incoming light would be limited by an amount controlled by the lens. In an example from FIG. 13, primary angle-limiting device 300 limits incident light 180 to ±40 deg, thus if angle-of-incidence device 140 further limits incident light 180 to ±10 degrees the limiting of incident light 180 to ±40 degrees can improve the performance of angle-of-incidence device 140 by reducing high-angle reflections within angle-of-incidence device 140.

FIG. 14 provides a side view of another example optical sensor with an angle limiting element positioned above angle-of-incidence device 140. In the example, the primary angle-limiting device 300 positioned above the angle-of-incidence device in an optical sensor stack is a conical structure that limits incident light 180 to incoming light angles based on the angle of the conical structure and the thickness of primary angle-limiting device 300.

FIG. 15 provides a side view of another example optical sensor with angle-of-incidence device 140 formed as an angle-of-incidence stack 310. In the example, multiple lines of collimating material are "stacked" on top to form angle-of-incidence device 140, an example of which is as further illustrated in FIG. 16. In the example from FIG. 16, 2 layers of parallel lines of collimating material can be positioned perpendicular to each other, together forming offset rectangular collimating elements. Other examples (not shown) include 3 layers of parallel lines of collimating material forming hexagonal collimating elements, 4 layers of parallel lines of collimating material forming octagonal collimating elements and so forth.

FIGS. 17A-17D illustrate optical sensor devices incorporating various elements integrated with an angle-of-incidence device to form an angle-of-incidence stack. Referring to FIG. 17A, the collimating elements/pinholes of angle-of-incidence device 140 can be fabricated using patterned polymers, Germanium, or similar materials. In an example, the angle-of-incidence device 140 is integrated directly on the top of the sensor device in a post-processing step. In another example, the integrated angle-of-incidence device 140 can include an additional integrated rejection filter. Rejection filters can be any of bandpass filters, longpass filters and shortpass filters, among other examples. Bandpass filters selectively transmit a particular spectrum range while rejecting the other wavelengths and are found in a variety of applications, including chemistry, fluorescence microscopy, high-speed optical imaging, and spectroscopy. Longpass filters are designed to allow (relatively) long wavelengths to pass while blocking shorter wavelengths of light. Shortpass filters are a form of edge filter, designed to isolate desired wavelengths in the spectrum, and "cut" undesired wavelengths out of the optical system. For example, optical-waveguide band-rejection filters allow side-lobe levels to be reduced by several orders of magnitude while the roll-off rate of the response characteristics is not appreciably degraded. The arrangement/location of angle-of-incidence device 140 and filter array 160 and/or rejection filters in the angle-of-incidence stack may be altered to accommodate performance parameters of the optical sensor.

FIG. 17B includes a transparent layer 500 between incident light 180 and the angle-of-incidence device 140. Transparent layer 500 can be composed of amorphous glass (SiOx) or similar material to pass light, for example to provide protection from mechanical stress and/or improve manufacturability. In an example, transparent layer 500 with integrated angle-of-incidence device 140 is attached to the top of the sensor using adhesive 510. Adhesive 510 can comprise any suitable material that will provide adequate adhesion and can additionally be selected to provide a uniform and/or predictable distance (such as the predefined distance D from FIG. 4) between the integrated transparent layer 500 and the filter array 160. In an example, adhesive 510 is applied on the exterior sides of the optical sensor or is applied under the entire surface of the integrated transparent layer 500 and angle-of-incidence device 140. As detailed in FIG. 17A, the collimating elements/pinholes of angle-of-incidence device 140 can be fabricated using patterned polymers, Germanium, or similar materials and can contain, for example, fluorocarbon organic polymer (FOP). In an example, the integrated transparent layer 500 can integrate a rejection filter or diffusor, such as diffusion layer 190 from FIG. 5, for example on the side opposing the angle-of-incidence (AOI) control features.

FIG. 17C includes a shielding structure 520 on the posterior surface of the angle-of-incidence device 140. In an example, shielding structure 520 can comprise metal or any other suitable dark/opaque structure and can be sufficiently thin to block incident light 180 passing through the opaque material of angle-of-incidence device 140 without impacting the performance of angle-of-incidence device 140. In an example, a suitable metal material is sputtered or deposited using an e-beam deposition process on the posterior surface of the material comprising angle-of-incidence device 140 prior to integration of the transparent layer 500/angle-of-incidence device 140 with the optical sensor array and can be formed/etched in a process complimenting the formation of the collimating elements of angle-of-incidence device 140. By including shielding structure 520 to the angle-of-incidence stack, any incident light traveling through the opaque material of angle-of-incidence device 140 can be further attenuated or even arrested. It is understood that the optical device of FIG. 17 C may also integrate a rejection filter or diffusor (such as diffusion layer 190 form FIG. 5) on the surface opposing the angle-of-incidence device 140. As in the optical sensor of FIG. 17B, adhesive 510 can be applied on the exterior sides of the optical sensor, applied under the entire surface, or may be integrated as a single structure.

In an example applicable to FIGS. 17A-17D, angle-of-incidence device 140 may be applied using a deposition process, a spin-on process or adhesive to the surface of transparent layer 500, then etched using DRIE, wet etch or other process to define the collimating elements of angle-of-incidence device 140. In an example an etch stop, such as a nitride material, is deposited on the surface of transparent layer 500 prior to deposition of the material for angle-of-incidence device 140, providing an etch stop between transparent layer 500 during the formation of the collimating elements of angle-of-incidence device 140.

FIG. 17D provides a modified angle-of-incidence device 530 glued on top of the filter and sensor arrays. In an example of implementation illustrated in FIG. 17A, the collimating elements/pinholes of angle-of-incidence device 140 can be fabricated using patterned polymers, Germanium, or similar materials and may contain fluorocarbon organic polymer (FOP). In another example illustrated in FIG. 17B, the optical sensor may also integrate a rejection filter or diffusor (such as diffusion layer 190 from FIG. 5) on the surface opposing the angle-of-incidence device (AOI) 140. Referring to the optical sensor of FIG. 17B, in a specific example of implementation, adhesive 510 can be applied on the exterior sides of the optical sensor, applied under the entire surface, or may be integrated as a single structure.

In a specific example of implementation and operation, an optical sensor system comprises an array of optical sensors arranged on an integrated circuit and a plurality of filters with the bottom surface of the plurality of filters located above the top surface of the array of optical sensors. In an example, an angle-of-incidence layer includes a top surface, a bottom surface, and a thickness Y, where the bottom surface of the angle-of-incidence layer is located a predetermined distance X from the top surface of the plurality of filters and the angle-of-incidence layer includes a plurality of collimating elements, with each collimating element of the angle-of-incidence layer having an aperture width Z.

In a specific example, the plurality of collimating elements includes a plurality of sets of collimating elements, each collimating element of a given set has a substantially the same respective aperture width Z and the aperture width Z for each set is different from any other set of the plurality of sets of collimating elements. In another specific example, the aperture width Z, the angle-of-incidence layer thickness Y and the predetermined distance X are adapted to limit the angle-of-incidence of light exiting the collimating layer below a maximum angle. In yet another example, an optical sensor system also includes a diffusion layer with a top surface and a respective bottom surface that can be between the plurality of filters and the array of optical sensors where the diffusion layer bottom surface is atop the top surface of the plurality of filters or between the plurality of filters and the optical sensor array.

In a specific example, an optical sensor system can include one or more lenses for directing light received at the angle-of-incidence layer or at a diffusion layer. In another example, the angle-of-incidence layer top surface and bottom surface are between the bottom surface of the plurality of filters and the top surface of the array of optical sensors and in yet another example, the bottom surface of the angle-of-incidence layer is atop the top surface of the plurality of filters.

In a specific example, the angle-of-incidence layer for an optical sensor system extends beyond the edges of an array of optical sensors and in another example the angle-of-incidence layer incorporates a fiber-optic plate. In another specific example, the top surface and the bottom surface of the plurality of filters for an optical sensor system is between the bottom surface of the angle-of-incidence layer array and the top surface of the array of optical sensors.

In another example, an optical sensor system includes one or more rejection filters, with each rejection filter having a top surface and a bottom surface, where the bottom surface and bottom surface of the rejection filters being coplanar to the top surface of an array of optical sensors. In another example, each collimating element (pinhole) of an angle-of-incidence layer further has an interior side wall, where the side wall is used to form an interior void that is in one or more of a cone shape, an inverted cone shape, a serrated shape, an hourglass shape, a stacked cone shape, a sawtooth shape a hyperboloid shape, and a modified hyperboloid shape, where the top portion of the hyperboloid has a smaller aperture than the bottom portion of the hyperboloid and the bottom portion of the hyperboloid further includes a constricting element 143.

In another specific example, an optical sensor system includes both a primary angle limiting device that can be a single lens, or a small number of additional lenses, located atop the angle-of-incidence layer with its collimating elements. In another example of an optical sensor system, the top surface of the angle-of-incidence layer is coupled to the bottom surface of the plurality of filters with an adhesive, where the adhesive is manufactured to maintain a predetermined distance D between the angle-of-incidence layer and the plurality of filters. An example adhesive can be pre-manufactured to take an approximate shape and size that will allow the adhesive to sufficiently resist shrining the predetermined distance D. Options for adhesives include, but are not limited to, typical organic adhesives and silicon adhesives. The adhesive can also comprise a plurality of layers, for example a resin and adhesive sandwich and/or an adhesive polyimide sandwich. Other options include preforming the adhesive into a regular or modified O-ring shape.

In a specific example of implementation and operation, an optical sensor system includes an angle-of-incidence layer that comprises a primary angle-of-incidence element and a secondary angle-of-incidence element, where the primary angle-of-incidence element is offset from the secondary angle-of-incidence element and where the primary angle-of-incidence elements and secondary angle-of-incidence elements form the plurality of collimating elements.

FIG. 18 provides a method for manufacturing an optical sensor system. In a specific example of implementation and operation, a method for manufacturing an optical sensor system begins at step 600 with the forming an array of optical sensors on an integrated circuit. In an example, the array of optical sensors is formed atop the active circuitry of the integrated circuit and in another example, the array of optical sensors is formed on the backside of the integrated circuit. The method continues at step 610, where a plurality of filters are formed on the array of optical sensors. In an example, the plurality of filters comprise Fabry-Pérot interferometers configured as a pair of partially reflective glass optical flats spaced apart that require multiple deposition and lithography steps. In a related example, all or a portion of the Fabry-Pérot interferometers are configured as multiple pairs of partially reflective glass optical flats with the reflective surfaces facing each other in a stack. In yet another example, the plurality of filters comprise alternative optical filters types, such as organic filters, or a combination of alternate optical filter types and Fabry-Pérot interferometers.

The method continues at step 620, with the addition of an angle-of-incidence device (angle-of-incidence layer) on the plurality of filters. In an example, the angle-of-incidence layer is formed separately and adhered to the plurality of filters using an adhesive. In another example, the angle-of-incidence layer is formed on the plurality of filters using an intermediate layer, such as a substantially transparent material, or a layer configured to diffuse light passing to the plurality of filters after exiting from the angle-of-incidence layer. In yet another example, the angle-of-incidence layer is formed on a sacrificial layer that is removed after the angle-of-incidence layer is formed and/or adhered to the surface of the integrated circuit surface. In a related example, the angle-of-incidence layer is supported on two or more of its respective edges by depositing a material and subsequently defining supports in one or more lithographic steps. In a specific example, the forming of the of the angle-of-incidence layer in step 620 can be reversed with step 610, with the plurality of filters being formed on top of the angle-of-incidence layer, including the additional steps above. In optional step 630 a diffusion layer is adhered to the angle-of-incidence layer. As above, the diffusion layer can be formed on the angle-of-incidence layer or formed separately and applied to the surface of the angle-of-incidence layer in an additional step. In optional step 640 one or more lens or lenses (such as an array of lenses) is applied to the diffusion layer of step 630. In an alternative example, there is no diffusion layer step 630 and the lens or lenses are applied directly or in a series of steps to the angle-of-incidence layer.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. An optical sensor system comprises:
   an array of optical sensors arranged on an integrated circuit, the array of optical sensors having a respective top surface;
   a plurality of filters having a respective top surface and a respective bottom surface, wherein the bottom surface of the plurality of filters is located proximal to the top surface of the array of optical sensors; and
   an angle-of-incidence layer having a respective top surface, a respective bottom surface, and a respective thickness Y, wherein the bottom surface of the angle-of-incidence layer is located a predetermined distance X from the top surface of the plurality of filters, wherein the angle-of-incidence layer includes a plurality of collimating elements, wherein each collimating element of the angle-of-incidence layer has an aperture width Z, wherein the aperture width Z, the angle-of-incidence layer thickness Y and the predetermined distance X are adapted to limit an angle-of-incidence of light exiting the angle-of-incidence layer below a desired angle and, wherein the bottom surface of the angle-of-incidence layer is atop the top surface of the plurality of filters.

2. The optical sensor system of claim 1, wherein the plurality of collimating elements includes a plurality of sets of collimating elements, wherein each collimating element of a set of the plurality of sets of collimating elements has a substantially same respective aperture width Z, wherein the aperture width Z for each set of the plurality of sets of collimating elements is different from any other set of the plurality of sets of collimating elements.

3. The optical sensor system of claim 1, further comprising a diffusion layer having a respective top surface and a respective bottom surface.

4. The optical sensor system of claim 3, wherein the diffusion layer top surface and bottom surface are between the plurality of filters and the array of optical sensors.

5. The optical sensor system of claim 3, wherein the bottom surface of the diffusion layer is atop the top surface of the plurality of filters.

6. The optical sensor system of claim 1, wherein the angle-of-incidence layer top surface and bottom surface are between the bottom surface of the plurality of filters and the top surface of the array of optical sensors.

7. The optical sensor system of claim 1, wherein the angle-of-incidence layer is adapted to extend beyond one or more edges of the array of optical sensors.

8. The optical sensor system of claim 1, wherein the angle-of-incidence layer comprises a fiber-optic plate.

9. The optical sensor system of claim 1, further comprising:
one or more rejection filters, each of the one or more rejection filters having a respective top surface and a respective bottom surface, wherein the bottom surface of the one or more rejection filters is parallel to the top surface of the array of optical sensors.

10. The optical sensor system of claim 1, wherein each collimating element of the angle-of-incidence layer further has a side wall, wherein the side wall has a form that is at least one of:
a cone shape;
an inverted cone shape;
a serrated shape;
an hourglass shape;
a stacked cone shape;
a sawtooth shape;
a hyperboloid shape, and
a modified hyperboloid shape, wherein a top portion of the hyperboloid has a smaller aperture than a bottom portion of the hyperboloid.

11. The optical sensor system of claim 1, further comprising:
one or more lenses.

12. The optical sensor system of claim 1, wherein the top surface of the angle-of-incidence layer is coupled to the bottom surface of the plurality of filters with an adhesive, wherein the adhesive is adapted to maintain a predetermined distance D between the angle-of-incidence layer and the plurality of filters.

13. The optical sensor system of claim 1, further comprising:
another angle-of-incidence layer proximal to the angle-of-incidence layer.

14. The optical sensor system of claim 1, wherein the angle-of-incidence layer comprises a plurality of primary angle-of-incidence elements and a plurality of secondary angle-of-incidence elements, wherein the plurality of primary angle-of-incidence elements are adapted to be offset from the plurality of secondary angle-of-incidence elements and wherein the primary angle-of-incidence elements and secondary angle-of-incidence elements form the plurality of collimating elements.

15. A method for manufacturing an optical sensor system, the method comprising:
forming an array of optical sensors on an integrated circuit, the array of optical sensors having a respective top surface;
forming a plurality of filters having a respective top surface and a respective bottom surface, wherein the bottom surface of the plurality of filters is located proximal to the top surface of the array of optical sensors; and
forming an angle-of-incidence layer having a respective top surface, a respective bottom surface, and a respective thickness Y atop the plurality of filters, wherein the bottom surface of the angle-of-incidence layer is located a respective predetermined distance X from the top surface of the plurality of filters, wherein the angle-of-incidence layer includes a plurality of collimating elements, each collimating element of the plurality of the angle-of-incidence layer having a respective aperture width Z, wherein the aperture width Z, the angle-of-incidence layer thickness Y and the predetermined distance X are adapted to limit an angle-of-incidence of light exiting the angle-of-incidence layer below a desired angle.

16. The method of claim 15, further comprising:
forming a rejection filter having a respective top surface, a respective bottom surface, and a respective thickness D atop a diffusion layer.

17. The optical sensor system of claim 1, wherein the bottom surface of the angle-of-incidence layer is directly atop the top surface of the plurality of filters.

18. The optical sensor system of claim 1, wherein the aperture is configured to form an interior void.

19. The method of claim 15, further comprising:
forming a diffusion layer having a respective top surface, a respective bottom surface, and a respective thickness D atop the angle-of-incidence layer.

20. The method of claim 15, wherein the angle-of-incidence layer comprises a fiber-optic plate.

* * * * *